US 9,911,946 B2

(12) United States Patent
Scire et al.

(10) Patent No.: US 9,911,946 B2
(45) Date of Patent: Mar. 6, 2018

(54) OPTOELECTRONIC COMPONENT, A METHOD FOR MANUFACTURING AN OPTOELECTRONIC COMPONENT, AND A METHOD FOR PROCESSING A CARRIER

(71) Applicant: Infineon Technologies Dresden GmbH, Dresden (DE)

(72) Inventors: Alessia Scire, Dresden (DE); Dieter Kaiser, Dresden (DE); Tarja Hauck, Dresden (DE); Frank Zschorlich, Wittichenau (DE)

(73) Assignee: INFINEON TECHNOLOGIES DRESDEN GMBH, Dresden (DE)

( * ) Notice: Subject to any disclaimer, the term of this patent is extended or adjusted under 35 U.S.C. 154(b) by 0 days.

(21) Appl. No.: 15/387,772

(22) Filed: Dec. 22, 2016

(65) Prior Publication Data
US 2017/0104187 A1     Apr. 13, 2017

Related U.S. Application Data

(62) Division of application No. 14/064,302, filed on Oct. 28, 2013, now Pat. No. 9,564,550.

(51) Int. Cl.
H01L 51/56     (2006.01)
H01L 51/52     (2006.01)
H01L 27/32     (2006.01)

(52) U.S. Cl.
CPC .......... *H01L 51/56* (2013.01); *H01L 27/3276* (2013.01); *H01L 51/5275* (2013.01)

(58) Field of Classification Search
CPC ......... H01L 2924/0002; H01L 2924/00; H01L 33/0079; H01L 27/322; H01L 27/3244

USPC ......................................... 257/40, 98; 438/32
See application file for complete search history.

(56) References Cited

U.S. PATENT DOCUMENTS

| 7,768,023 B2* | 8/2010 | Diana .................... B82Y 20/00 |
| | | 257/98 |
| 8,012,780 B2* | 9/2011 | Yoshimoto ............ B82Y 20/00 |
| | | 359/566 |
| 8,440,485 B2* | 5/2013 | Wei ..................... H01L 21/0237 |
| | | 257/E23.012 |
| 2003/0216100 A1 | 11/2003 | Lee et al. |
| 2005/0249473 A1* | 11/2005 | Page ....................... B82Y 20/00 |
| | | 385/129 |
| 2007/0205525 A1* | 9/2007 | Engl ................. B29D 11/00278 |
| | | 264/1.6 |

(Continued)

FOREIGN PATENT DOCUMENTS

EP     2190082 B1     1/2013

*Primary Examiner* — David Vu
*Assistant Examiner* — Jonathan Han
(74) *Attorney, Agent, or Firm* — Viering, Jentschura & Partner mbB

(57) ABSTRACT

According to various embodiments, an optoelectronic component may be provided, the optoelectronic component including: an electrode structure disposed at least one of over and in a carrier; and a grating structure disposed over the electrode structure, the grating structure including at least a first region and a second region, wherein the first region of the grating structure includes amorphous silicon; and wherein the second region of the grating structure includes a material having a refractive index different from the refractive index of the amorphous silicon.

16 Claims, 9 Drawing Sheets

(56) References Cited

U.S. PATENT DOCUMENTS

2010/0128749 A1   5/2010  Amann et al.
2010/0172615 A1*  7/2010  Ben Bakir ............. B82Y 20/00
                                                         385/49

* cited by examiner

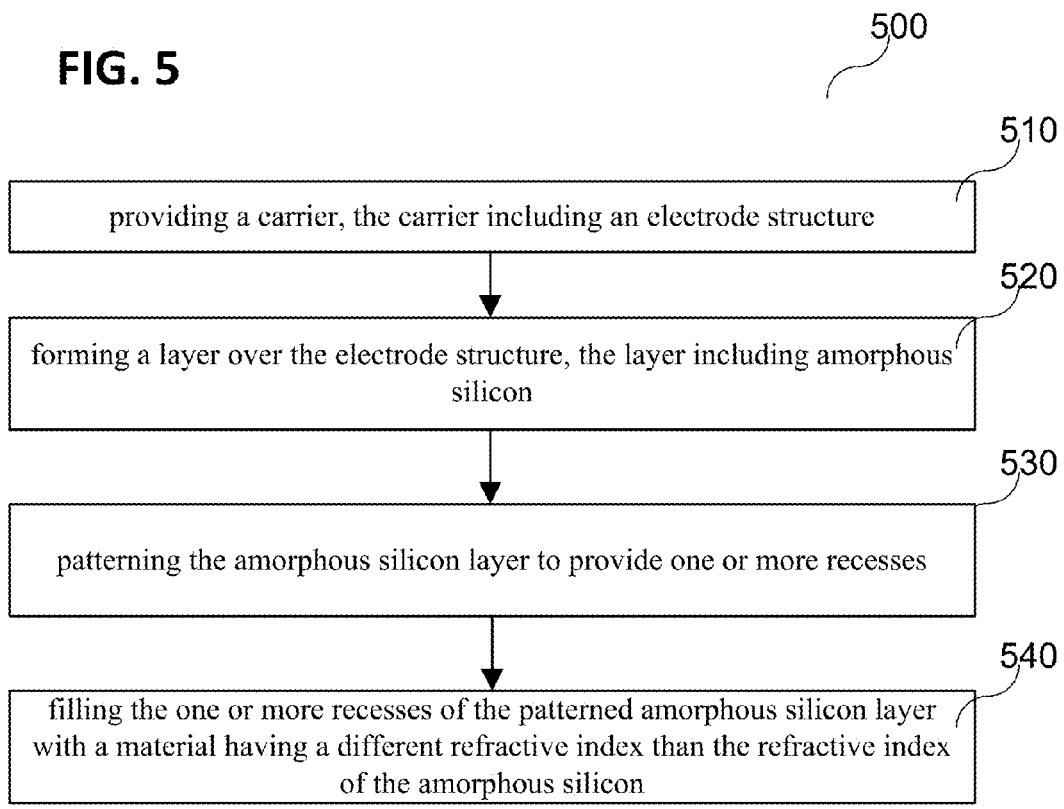

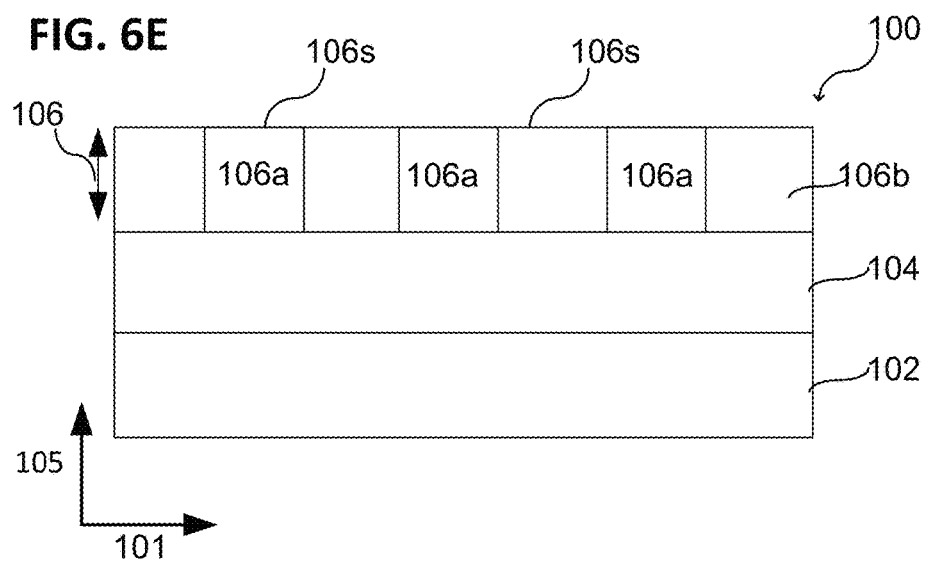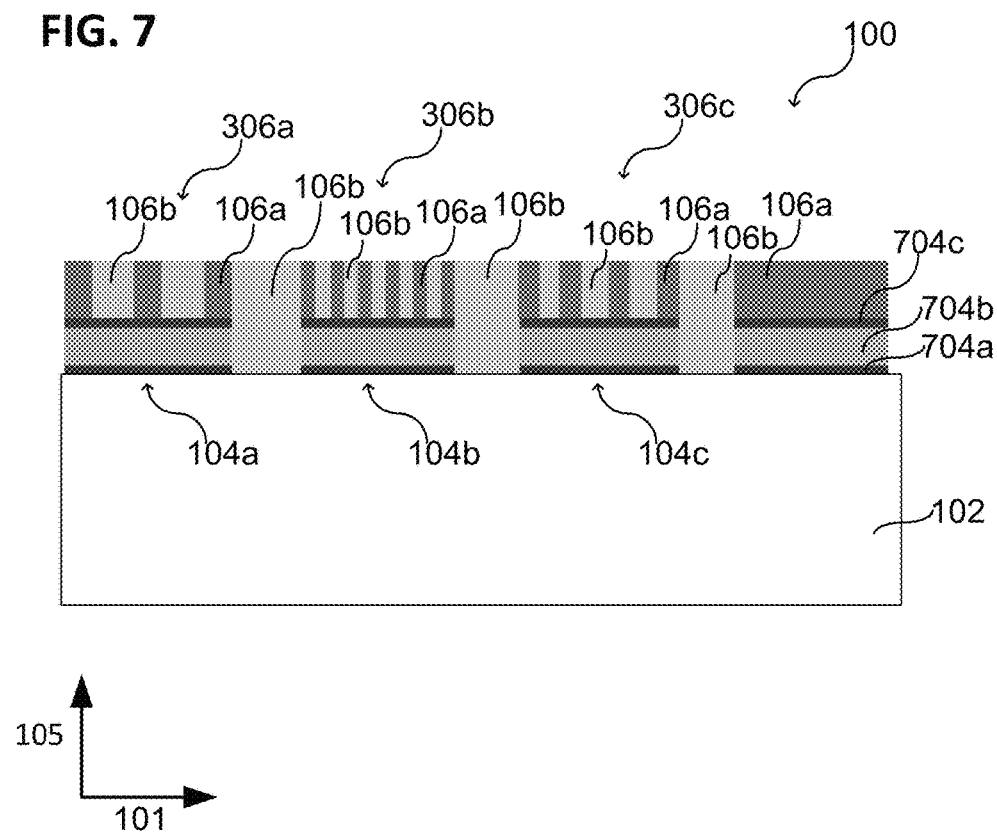

OPTOELECTRONIC COMPONENT, A METHOD FOR MANUFACTURING AN OPTOELECTRONIC COMPONENT, AND A METHOD FOR PROCESSING A CARRIER

CROSS-REFERENCE TO RELATED APPLICATIONS

The present application is a divisional of U.S. patent application Ser. No. 14/064,302 filed Oct. 28, 2013, the entirety of which is herein incorporated by reference.

TECHNICAL FIELD

Various embodiments relate generally to an optoelectronic component, a method for manufacturing an optoelectronic component, and a method for processing a carrier.

BACKGROUND

In general, an optoelectronic component, as for example a light emitting diode (LED) or an organic light emitting diode (OLED) may be manufactured on a carrier, wherein the carrier may be or may not be transparent to the specific wavelength of the light being radiated from the diode depending on the type of the light emitting diode, e.g. the diode may be a top emitting diode, a bottom emitting diode, or a diode emitting light into various directions. A light emitting diode may include at least two electrodes, an anode and a cathode, being separated by an electroluminescent material (e.g. by a so-called emitter layer or emitter structure) such that light may be emitted from the light emitting diode in response to an electric current or to an electrical field being applied between the at least two electrodes. The electrodes may include an electrically conductive material allowing a charge carrier transport into the electroluminescent material. The light may be emitted from the electroluminescent material due to recombination of electrons and holes being for example injected into the electroluminescent material. It may be possible to manufacture a layer stack including a light emitting layer (e.g. an electroluminescent material) over an electronic circuit on a carrier, e.g. on a silicon wafer. However, integrating the processing of an optoelectronic structure into a semiconductor process flow may be difficult, since the individual parts of the manufacturing process may respectively require specific conditions to be realized in the common manufacturing process.

SUMMARY

According to various embodiments, an optoelectronic component may be provided, the optoelectronic component may include: an electrode structure disposed at least one of over and in a carrier; and a grating structure disposed over the electrode structure, the grating structure including at least a first region and a second region, wherein the first region of the grating structure includes amorphous silicon; and wherein the second region of the grating structure includes a material having a refractive index different from the refractive index of the amorphous silicon.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 5 shows in a schematic flow diagram a method for manufacturing an optoelectronic component, according to various embodiments;

FIGS. 6A to 6E respectively show a carrier in a schematic side view or cross sectional view during processing or during manufacture of an optoelectronic component, according to various embodiments; and FIG. 7 schematically shows in a cross sectional view or side view an optoelectronic component, according to various embodiments.

DESCRIPTION

Figure 1:
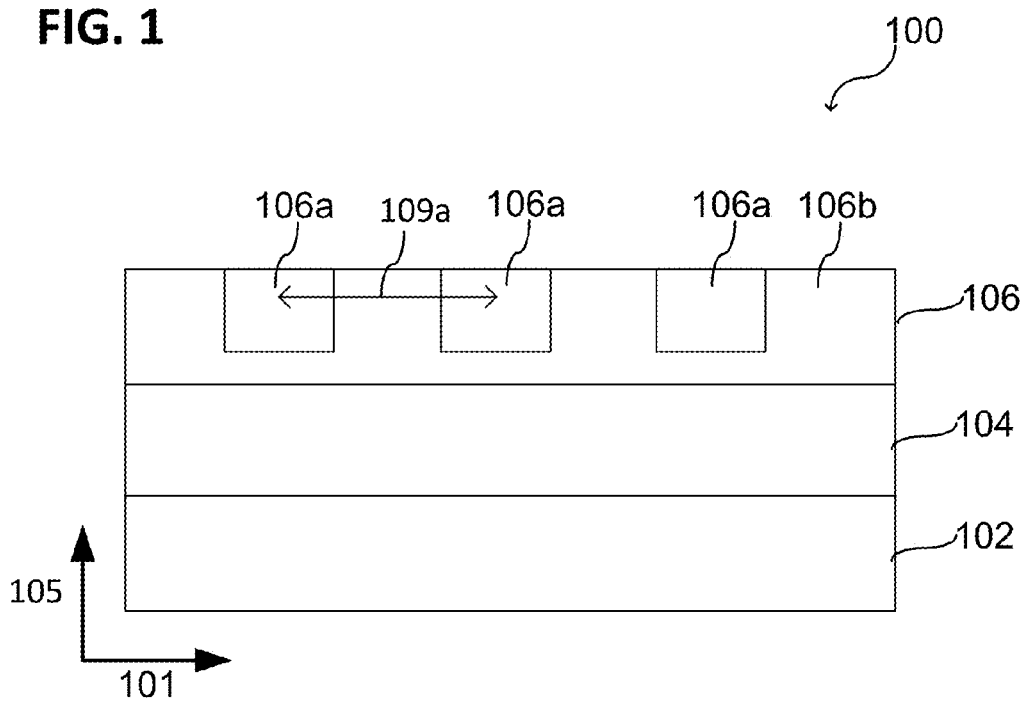
FIG. 1 schematically shows in a cross sectional view or side view an optoelectronic component, according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a carrier) or "laterally" surrounding, may be used herein to mean an extension along a direction parallel to a surface of a carrier. That means that a surface of a carrier (e.g. a surface of a substrate, or a surface of a wafer) may serve as reference, commonly referred to as the main processing surface of a wafer (or the main processing surface of another type of carrier). Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a carrier (e.g. perpendicular to the main processing surface of a carrier).

In general, semiconductor industry processes have been developed to provide high quality layers (also referred to as thin films or thin layers), wherein the layers may be formed for example having a desired (predefined) thickness and/or morphology. Further, the layer may be provided realizing a large range of desired (predefined) properties, e.g. edge-covering behavior, electronic properties, optical properties, and/or chemical properties. Thin film technology or layering technology may enable the manufacturing of an optoelectronic device, e.g. an organic light emitting diode (OLED), a display including a plurality of OLEDs, which may be formed on a wafer or a carrier using processes of semiconductor industry.

In general, there may be a large number of applicable deposition processes or layering processes, e.g. physical vapor deposition processes (PVD), chemical vapor deposition processes (CVD), which may be used to form (grow or deposit) a layer or a thin film of a specific material. However, the morphology and the microstructure of a thin film or a layer may influence and determine the physical (optical and electrical) properties of the thin film or of the layer. The control of the morphology and the microstructure during thin film growth may be beneficial in semiconductor processing, e.g. for layering processes, patterning processes, and the like. A substantial part of the morphology of a grown (formed or deposited) layer may be reflected in the surface roughness of the layer, wherein another aspect of the thin film growth may address the microstructure of the layer (e.g. grain size, grain boundaries, cracks, dislocations, defects, strain and the like). The surface roughness of a layer may be quantified by the vertical deviations of a real surface from the respective shape of the corresponding ideal form of the surface. The Roughness may be quantified as RMS-roughness (root-mean-squared-roughness), wherein the vertical deviations of the height (or thickness) of the thin film or layer may be correlated with the arithmetic value of the height or thickness. As referred to herein, a smooth layer may have a low surface roughness, e.g. smaller than about 5 nm RMS-roughness, or smaller than about 3 nm RMS-roughness.

In general, an electronic circuit (or in analogy an integrated circuit) may include a metallization structure, a so-called metallization (e.g. a single-level metallization including a single wiring layer or a multi-level metallization including a plurality of wiring layers being arranged in a layer stack), wherein the metallization structure may for example provide the electrical connection between electronic circuit structures for enabling the functioning of the electronic circuit and/or wherein the metallization structure may for example provide an access to the electronic circuit, e.g. to electrically connect the electronic circuit to a peripheral device or component. A wiring layer may include a patterned dielectric layer or a dielectric layer structure including an electrically insulating material (e.g. a dielectric material), wherein the dielectric layer or the dielectric layer structure may be configured to provide at least one of recesses, voids, holes, through holes, and the like, being filled with an electrically conductive material to provide the electrical wiring of the wiring layer; the electrical wiring may for example include one or more metal lines, one or more vias, and one or more contact structures. A contact structure may for example include at least one contact pad, being exposed at an upper surface of the wiring layer such that an access to the electrical wiring may be provided. In general, the metallization structure of an electronic circuit may be optimized under the aspects of cost efficiency, processability, durability and the like.

However, forming a layer (or thin film) or layer structure (or thin film structure) over a readily processed metallization, wherein the layer or layer structure may have the respectively desired chemical and physical properties, may be difficult, since a commonly used metallization may not provide the optimal basis for a layer or a layer structure. In general, it may be difficult to deposit for example polycrystalline silicon over an aluminum containing metallization or electrode structure, since the deposition or growth of polycrystalline silicon may require a temperature of larger than about 500° C. (or e.g. larger than about 550° C.), and the aluminum containing metallization or electrode structure may degrade at temperatures of larger than about 500° C. (or e.g. larger than about 550° C.). At these high temperatures, the aluminum of the metallization or electrode structure may for example start a recrystallization process which may result in a change of the surface morphology, e.g. in a high roughness larger than about 10 nm RMS-roughness; and, as a result, the metallization or electrode structure may not have for example the suitable properties for providing an electrode or a basis of an optoelectronic structure, e.g. the optoelectronic structure may be an optoelectronic layer stack to be formed over the metallization or electrode structure to provide for example a light emitting device.

Illustratively, various embodiments described herein may be based on the realization, that it may be difficult to grow polycrystalline silicon over a metallization, e.g. directly on a metal contact pad or on a metal electrode. According to various embodiments, it was recognized, that it may be possible to form an amorphous silicon layer over a metal surface (e.g. over an electrode structure or over a metallization including for example aluminum), and, that using the amorphous silicon layer it may be possible to provide a grating structure over the metal surface without damaging the metal contact pad or the metal electrode related to the metal surface. The grating structure based on amorphous silicon may have suitable optical properties to enhance the light out-coupling (light extraction) of a light emitting structure being formed over the grating structure and may provide a suitable basis for depositing an optoelectronic structure or layer stack over the grating.

According to various embodiments, on top of wafer level CMOS, a metal electrode may be used as anode for an optoelectronic structure, e.g. an OLED, wherein a conductive a-Si/SiO$_2$ (amorphous silicon/silicon oxide) grating may be provided between the metal electrode and the active layer of the optoelectronic structure, e.g. between the anode and the electroluminescence layer, wherein the optoelectronic structure may be formed over the grating, wherein the grating may increase the light out-coupling efficiency and reduce the light losses due to internal reflection in the OLED layer itself. According to various embodiments, a top emitting OLED structure may be evaporated directly on the grating over the metal anode, wherein the metal anode may be a part of a metallization of a CMOS structure being disposed on a wafer, in a so called CMOS-backplane configuration. A conductive a-Si/SiO$_2$ (amorphous silicon/silicon oxide) grating may allow electrically connecting the OLED layer stack over the grating with the electrode structure or metallization structure below the grating; therefore, the conductive a-Si/SiO$_2$ grating may allow integrating an OLED into an electronic circuit on a carrier. The a-Si/SiO$_2$ grating may be deposited at a temperature which may not damage (or may not cause a degradation of) the underlying metallization structure, electrode structure, or electronic circuit. The amorphous silicon (a-Si) of the grating may have less-preferred optical properties (e.g. an increased absorption of light in the visible range) compared to for example polycrystalline silicon (poly-Si), but a-Si can be in-situ-doped and can be deposited at a temperature not affecting the underlying structures (e.g. an aluminum metallization or an aluminum electrode).

According to various embodiments, a design and integration scheme may be provided herein to add on top of a metal electrode a grating including materials with different refractive index to enhance the amount of light that will be able to be emitted by the OLED. According to various embodiments, the grating or grating structure may act as photonic-crystal. Further, different grating patterns (e.g. provided over the metallization of a carrier) may act selectively on the wavelength of the emitted light.

According to various embodiments, the same aspects described herein may also apply for an optoelectronic structure to be formed over a metallization of a carrier, e.g. over a metallization of a glass carrier, over a metallization of a metal carrier, or over a metallization of any other type of carrier, e.g. over a metallization of a semiconductor carrier.

According to various embodiments, an optoelectronic component (e.g. an optoelectronic device or a part of an optoelectronic device) and a method for manufacturing an optoelectronic component (or processing a carrier to provide an optoelectronic component) may be provided herein, wherein the optoelectronic component may be formed in semiconductor technology.

Since there may be many individual processes used in semiconductor processing (e.g. during the manufacture of an optoelectronic component, during the manufacture of a metallization structure, and/or during the manufacture of an optoelectronic structure or an optoelectronic layer stack, e.g. during front-end-of-line processing of a carrier or of a wafer and back-end-of-line processing of a carrier or of a wafer), usually carried out in sequence, several basic manufacturing techniques may be used at least once in the overall manufacturing process. The following description of basic techniques should be understood as illustrating examples, which techniques may be included in the processes described herein or which techniques may be used to provide a contact pad structure as described herein. The exemplarily described basic techniques may be not necessarily need to be construed as preferred or advantageous over other techniques or methods, since they only serve to illustrate how one or more embodiments of the invention may be practiced. For sake of brevity, the illustration of exemplarily described basic techniques may be only a short overview and should not be considered as exhaustive specification.

According to various embodiments, forming a layer (e.g. depositing a layer, depositing a material, and/or applying a layering process) as described herein may also include forming a layer, wherein the layer may include various sub-layers, whereby different sub-layers may include different materials respectively. In other words, various different sub-layers may be included in a layer, or various different regions may be included in a deposited layer and/or in a deposited material.

According to various embodiments, at least one layering or at least one layering process may be used in a method for manufacturing an optoelectronic component or during forming a metallization structure (a dielectric layer or a wiring layer), during forming an electronic circuit, or during forming an optoelectronic structure, as described herein. In a layering process, a layer (also generally referred to as film or thin film) may be deposited over a surface (e.g. over a carrier, over a wafer, over a substrate, over another layer, over a plurality of structure elements, and the like) using deposition techniques which may include chemical vapor deposition (CVD, or a CVD process) and/or physical vapor deposition (PVD, or a PVD process), according to various embodiments. The thickness of a deposited layer may be in the range of a few nanometers up to several micrometers depending on its specific function. The thickness of a deposited layer may be regarded as the spatial extension of the deposited layer along its growth direction. Thin layers in the range of a few nanometers, e.g. having a layer thickness smaller than 50 nm, may be formed using an atomic layer deposition (ALD). A conformal layer, e.g. covering the sidewalls of a structure element or covering vertical sidewalls, may be formed using an atomic layer deposition (ALD) or another suitable conformal deposition process, as for example low pressure chemical vapor deposition (LPCVD).

According to various embodiments, a deposited (formed or provided) layer may include at least one of an electrically insulating material, an electrically semiconducting material, and/or an electrically conductive material, depending on the respective specific function of the deposited layer. According to various embodiments, electrically conductive materials, as for example aluminium, aluminium-silicon alloys, aluminium-copper alloys, copper, nichrome (an alloy of nickel, chromium, and/or iron), tungsten, titanium, titanium nitride, molybdenum, platinum, gold, carbon (graphite), or the like, may be deposited using a CVD process or a PVD process. According to various embodiments, semiconducting materials, as for example silicon (e.g. silicon, polycrystalline silicon (also referred to as polysilicon), or amorphous silicon), germanium, a semiconductor compound material such as gallium arsenide (GaAs), indium phosphide (InP), or indium gallium arsenide (InGaAs) may be deposited using a CVD process. Insulating materials, as for example silicon oxide, silicon nitride, silicon oxynitride, metal oxides (e.g. aluminum oxide), organic compounds, polymers, (or the like) may be deposited using a CVD process or a PVD process. According to various embodiments, modifications of these processes may be used as described in the following.

According to various embodiments, a chemical vapor deposition process (CVD process) may include a variety of modifications, as for example atmospheric pressure CVD (APCVD), low pressure CVD (LPCVD), ultrahigh vacuum CVD (UHVCVD), plasma enhanced CVD (PECVD), high density plasma CVD (HDPCVD), remote plasma enhanced CVD (RPECVD), atomic layer CVD (ALCVD), vapor phase epitaxy (VPE), metal organic CVD (MOCVD), hybrid physical CVD (HPCVD), and the like. According to various embodiments, silicon, polysilicon, amorphous silicon, silicon dioxide, silicon nitride, and the like may be deposited using LPCVD or ALCVD. According to various embodiments, for example platinum, palladium, gold, titanium nitride, titanium oxide, may be deposited using atomic layer deposition (ALD or ALCVD).

According to various embodiments, a physical vapor deposition process may include a variety of modifications, as for example magnetron sputtering, ion-beam sputtering (IBS), reactive sputtering, high-power impulse magnetron sputtering (HIPIMS), vacuum evaporation, molecular beam epitaxy (MBE), and the like.

According to various embodiments, a layering process may further include thermal oxidation (also referred to as thermal oxidation process). Further, according to various embodiments, a process which may be applied to generate a metal layer may be plating, e.g. electroplating or electroless plating. According to various embodiments, a plating process may be used for forming a metal wiring structure or a metallization structure. According to various embodiments, a metallization structure may include for example one or more metal lines and one or more vias, and one or more contact pads being for example exposed at the upper surface of a metallization layer.

It should be noted, that a variety of combinations of materials and processes may be used in a layering process, according to various embodiments. Depending on specific aspects or desired properties of the layer to be formed, as for example crystalline quality, surface roughness, edge covering behavior, growth speed, and yield, the most suitable process may be applied for the respective material, according to various embodiments.

According to various embodiments, at least one patterning or at least one patterning process may be used for forming an optoelectronic component, an optoelectronic structure (an LED or OLED layer stack), a metallization structure, a contact pad structure (e.g. one or more contact pads), and the like, as described herein. A patterning process may include removing selected portions of a surface layer or of a material. After a surface layer may be partially removed, a pattern (or a patterned layer or patterned surface layer or a plurality of structure elements) may remain at least one of over and in the subjacent structure (e.g. a patterned base layer may remain on a subjacent structure). Since a plurality of processes may be involved, according to various embodiments, there are various possibilities to perform a patterning process, wherein aspects may be: selecting at least one portion of a surface layer (or at least one portion of a material, or at least one portion of a wafer) which shall be removed, e.g. via at least one lithographic process; and removing the selected portions of a surface layer, e.g. via at least one etch process.

It should be noted, that a lithographic process, including applying a resist (photo resist), exposing a resist, and developing a resist may also be considered as a patterning process, wherein a patterned resist layer (a soft mask, or a resist mask) may be generated by the lithographic process. Subsequently, a pattern may be transferred from a patterned resist layer to a previously deposited or grown layer (or a carrier, and the like) using an etch process, wherein the previously deposited or grown layer may include a hard mask material as for example an oxide or a nitride (e.g. silicon oxide, e.g. silicon nitride) creating a so-called hard mask.

According to various embodiments, an etch process, which may be included for example in a patterning process or which may be used for forming a recess, may be applied to remove material from a previously deposited layer, a grown surface layer, a carrier (or substrate, or wafer), and the like. An etch process may be adapted and performed depending on the specific requirements for the desired process. An etch process may include a wet etch process and/or a dry etch process. An etch process may be selective or non-selective with respect to two different materials or may be configured to be selective or non-selective, wherein a selective etch process may provide a different etching rate for a first material than for a second material and a non-selective etch process may provide the same etching rate for a first material and a second material. An etch process may be isotropic or anisotropic or may be configured to be isotropic or anisotropic, wherein an anisotropic etch process may have different etching rates along different spatial directions and an isotropic etch process may have the same etching rates along all spatial directions. An etch process may be anisotropic due to different etching rates along different crystallographic directions of the material to be etched. An etch process using a masking material and a dry etch process (e.g. plasma etching or reactive ion etching) may allow forming anisotropic structures, e.g. recesses.

According to various embodiments, a patterned layer may also serve as a mask (a so-called hard mask) for other processes like etching, ion implantation, and/or layering. Further, a patterned photoresist may also serve as a mask (a so-called soft mask). The mask material may usually be selected with regard to specific needs as for example chemical stability, e.g. to perform a selective etch process which does not affect the mask material (e.g. which may not etch away the mask material completely), or mechanical stability, e.g. to protect regions from being penetrated by ions, or to define the shape of generated structure elements during a layering process, and the like.

According to various embodiments, a carrier (e.g. a substrate, a wafer, and the like) may be made of semiconductor materials of various types, including silicon, germanium, Group III to V or other types, including polymers, for example, although in another embodiment, other suitable materials can also be used. The wafer substrate may be made of silicon (doped or undoped), in an alternative embodiment, the wafer substrate may be a silicon on insulator (SOI) wafer. As an alternative, any other suitable semiconductor materials can be used for the wafer substrate, for example semiconductor compound material such as gallium arsenide (GaAs), indium phosphide (InP), but also any suitable ternary semiconductor compound material or quaternary semiconductor compound material such as indium gallium arsenide (InGaAs). A carrier may include a coated structure, e.g. a metal tape coated with silicon, and the like. A carrier may further include a polymer, a laminate, or a metal. A carrier may further include a polymer foil, glass (e.g. silicon oxide based glass), or another suitable carrier being processable in semiconductor technology.

The term "dielectric" as used herein referring to a dielectric material, a dielectric layer, a dielectric structure, and the like, may be used herein to mean an electrically insulating material in general. Further the term "dielectric" may refer to a so-called low-κ material, as typically used in metallization structures in any semiconductor technology. According to various embodiments, at least one of the following materials may be used to provide a dielectric layer or a dielectric structure: silicon oxide (dielectric constant of 3.9) and a material having a smaller a dielectric constant than silicon oxide, e.g. fluorine-doped silicon dioxide, fluorosilicate glass, carbon-doped silicon dioxide, porous silicon dioxide, porous carbon-doped silicon dioxide, organic dielectrics, dielectric polymers, silicone based polymeric dielectrics, polynorbornenes, benzocyclobutene, polytetrafluoroethylene, resins, hydrogen silsesquioxane (HSQ), methylsilsesquioxane (MSQ) and the like.

FIG. 1 schematically shows an optoelectronic component 100 in a side view or cross sectional view, according to various embodiments, wherein the optoelectronic component 100 may include: an electrode structure 104 disposed at least one of over and in a carrier 102; and a grating structure 106 disposed over the electrode structure 104, wherein the grating structure 106 may include at least a first region 106a and a second region 106b, wherein the first region 106a of the grating structure 106 includes amorphous silicon; and wherein the second region 106b of the grating structure 106 includes a material having a refractive index different from the refractive index of the amorphous silicon.

According to various embodiments, the grating structure 106 may be in direct contact with the electrode structure 104. Further, the amorphous silicon defining the first region 106a of the grating structure 106 may be embedded or at least partially embedded into the material defining the second region 106b of the grating structure 106. Illustratively, the amorphous silicon may be surrounded or partially surrounded, e.g. laterally surrounded or partially laterally surrounded, by another material. The amorphous silicon in the first region 106a of the grating structure 106 may be at least partially transparent to light or to an electromagnetic radiation within or near the spectrum of the visible light (e.g. visible light, infrared light, ultraviolet light). The material of the grating structure 106 surrounding the amorphous silicon or being in contact with the amorphous silicon may be at least partially transparent to light or to an electromagnetic radiation within or near the spectrum of the visible light (e.g. visible light, infrared light, ultraviolet light).

According to various embodiments, the grating structure 106 may be an optical diffraction grating. The grating structure 106 may include a periodic structure (also referred to as grating), which influences incident light, e.g. splits and/or diffracts incident light or changes the travelling direction of the incident light. The periodic structure of the grating structure 106 may be provided by a layer 106 including periodically arranged first regions 106a of a first material having first optical properties (e.g. refraction index, reflectance, chromatic dispersion), the first optical properties may depend on the respective wavelength of the light. The surrounding 106b of the first regions 106a may include a second material having different optical properties than the first material. Further, the surrounding 106b of the first regions 106a may be free of a solid and/or liquid material providing thereby a surrounding 106b of the first regions 106a having different optical properties than the first regions 106a.

According to various embodiments, the first material providing the first regions 106a in the grating structure 106 may be amorphous silicon having a refractive index (real part of complex index of refraction) in the range from about 3.5 to 6.5 in the range of the visible light or for a part of the visible light. Further, the second material providing the one or more second regions 106b in the grating structure 106 may be silicon dioxide having a refractive index (real part of complex index of refraction) in the range from about 1.3 to 1.7 in the range of the visible light or for a part of the visible light, or silicon nitride having a refractive index (real part of complex index of refraction) in the range from about 1.9 to 2.2 in the range of the visible light or for a part of the visible light. Further, the second region 106b of the grating structure 106 may include a material having a smaller refractive index (real part of complex index of refraction) in the respective range of light than the amorphous silicon in the first regions 106a of the grating structure 106, e.g. silicon oxynitride, aluminum oxide, aluminum oxynitride, titanium oxide, and other metal oxides or metal oxynitrides.

According to various embodiments, the material providing the second region 106b of the grating structure 106 may be, in contrast to the material of the first region 106a of the grating structure 106, single crystalline or poly crystalline.

The grating structure 106 may serve to reflect light, to refract light, or to change of the propagation direction of the light interacting with the grating structure 106. The change of the propagation direction of the light may depend on the spacing 109a of the grating structure 106 (e.g. center to center or edge to edge) and the wavelength of the light interacting with the grating structure 106. Therefore, the grating structure 106 may act as the dispersive element.

According to various embodiments, the grating structure 106 may provide at least a part of an optoelectronic component 100.

According to various embodiments, the spacing 109a of the grating structure 106 (e.g. center to center) may be in the range from about several tens of nanometers to about several micrometers, e.g. in the range from about 100 nm to about 10 μm, e.g. in the range from about 100 nm to about 400 nm, depending on the wavelength of the light to be influenced by the grating structure 106.

According to various embodiments, the thickness or height (the spatial extension along the direction 105 shown in the figures) of the grating structure 106 or of the layer 106 providing the grating structure 106 may be in the range from about several tens of nanometers to about several hundreds of nanometers, e.g. in the range from about 30 nm to about 500 nm, e.g. in the range from about 50 nm to about 200 nm, e.g. in the range from about 10 nm to about 100 nm. According to various embodiments, the grating structure 106 may have a lateral extension of about several tens of nanometers up to several tens of micrometers, e.g. a lateral extension (a width) in the range from about 50 nm to about 50 μm, e.g. in the range from about 100 nm to about 10 μm; in the range from about 200 nm to about 3 μm. Further, according to various embodiments, the one or more first regions 106a of the grating structure 106 may have a lateral extension of about several tens of nanometers up to several micrometers, e.g. a lateral extension (a width) in the range from about 50 nm to about 10 μm, e.g. in the range from about 100 nm to about 1 μm; in the range from about 100 nm to about 500 nm.

According to various embodiments, the grating structure 106 (the grating plates) may be for example in the dimension of about 1 μm$^2$ (e.g. about 1 μm×1 μm) or about thousands of square micrometers (e.g. about 100 μm×100 μm), or in the dimension of about 1 mm$^2$ (e.g. about 1 mm×1 mm).

According to various embodiments, the one or more first regions 106a of the grating structure 106 may extend through the grating structure 106 or may partially extend in the grating structure 106.

According to various embodiments, the electrode structure 104 (or one or more electrode s104) may have substantially the same lateral extension as the grating structure 106. According to various embodiments, the electrode structure 104 and/or the grating structure 106 may have a lateral extension (along the direction 101 as shown in the figures) of about several tens of nanometers up to several tens of micrometers, e.g. a lateral extension (a width) in the range from about 50 nm to about 100 μm, e.g. in the range from about 100 nm to about 10 μm; in the range from about 200 nm to about 3 μm. Referring to this, at least one electrode of the electrode structure 104 may have a lateral extension of about several tens of nanometers up to several tens of micrometers, e.g. a lateral extension (a width) in the range from about 50 nm to about 50 μm, e.g. in the range from about 100 nm to about 10 μm; in the range from about 200 nm to about 3 μm.

According to various embodiments, the electrode structure 104 and/or the grating structure 106 may laterally extend over a carrier 102 or wafer 102, e.g. completely covering the carrier 102 or wafer 102 or partially covering the carrier 102 or wafer 102. The carrier 102 may be any semiconductor carrier, e.g. a silicon wafer, or another carrier being processable in semiconductor industry, e.g. a glass carrier, a polymer carrier, a foil, a polymer foil, a metal foil, and the like. Alternatively, the carrier may be a readily processed electronic circuit or integrated circuit, e.g. on wafer-level.

According to various embodiments, the electrode 104 or the electrode structure 104, as described herein, may provide a smooth electrically conductive primary layer which may be used as electrode layer in electronic devices and/or in optoelectronic devices, e.g. in semiconductor devices generating and/or converting light, e.g. in an organic light emitting diode (OLED), e.g. in an OLED-display. According to various embodiments, the electrode 104 or the electrode structure 104 and/or the grating structure 106 may be a part of at least one of the following optoelectronic components: a photodiode, a solar cell, an organic photodiode, an organic solar cell, a phototransistor, an organic phototransistor, a photomultiplier, an organic photomultiplier, an integrated optical circuit (IOC) element, an organic integrated optical circuit (IOC) element, a photo-resistor, a charge-coupled imaging device, an organic photo-resistor, an organic charge-coupled imaging device, a laser diode, an organic laser diode, a laser, a light emitting diode (LED), an organic LED (OLED), a top-emitting OLED, a bottom-emitting OLED, an active matrix organic light emitting diode (AMOLED).

Figure 2:
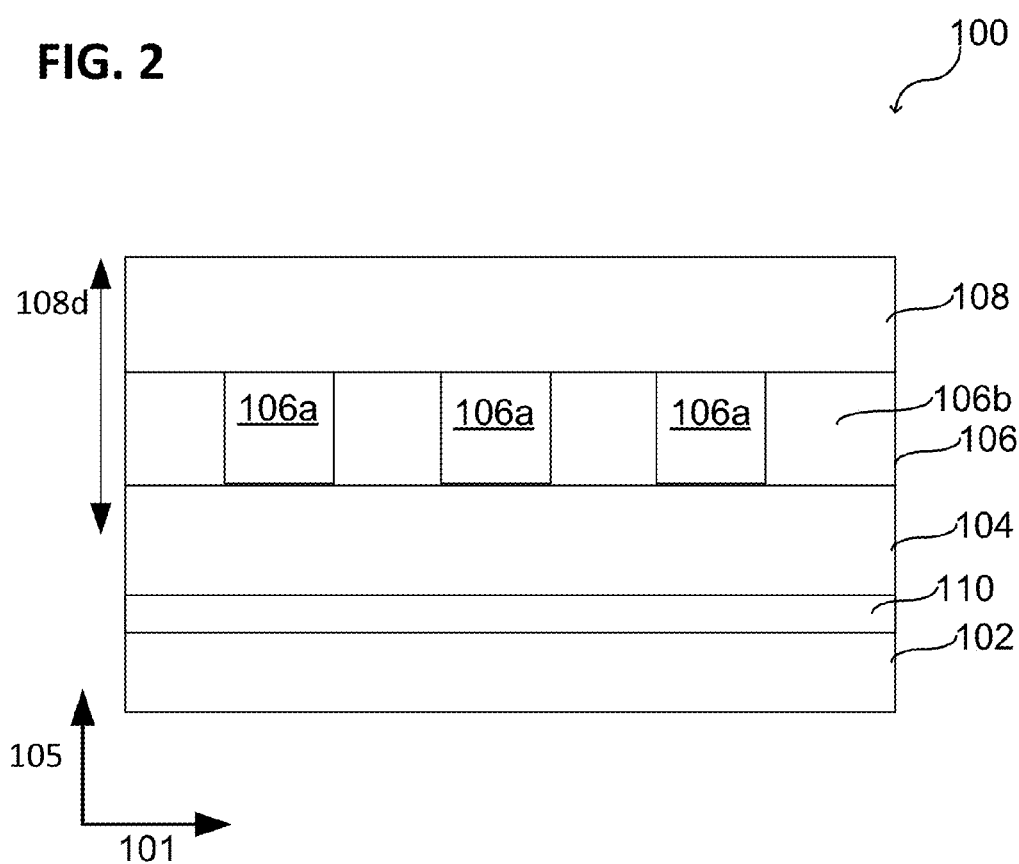
FIG. 2 schematically shows in a cross sectional view or side view an optoelectronic component including an optoelectronic structure, according to various embodiments.

As shown in FIG. 2, the optoelectronic component 100 may further include an optoelectronic structure 108 being disposed over the grating structure 106 and over the electrode structure 104, and over the carrier 102. The optoelectronic structure 108 may form together with the grating structure 106 and the electrode structure 104 an optoelectronic device 108d. Illustratively, the optoelectronic structure 108 may include an optoelectronic layer stack providing together with the grating structure 106 and with the optoelectronic structure 108 a photodiode, a solar cell, an organic photodiode, an organic solar cell, a phototransistor, an organic phototransistor, a photomultiplier, an organic photomultiplier, an integrated optical circuit (IOC) element, an organic integrated optical circuit (IOC) element, a photo-resistor, a charge-coupled imaging device, an organic photo-resistor, an organic charge-coupled imaging device, a laser diode, an organic laser diode, a laser, a light emitting diode (LED), an organic LED (OLED), a top-emitting OLED, a bottom-emitting OLED, and/or an active matrix organic light emitting diode (AMOLED).

According to various embodiments, the carrier 102 may for example include an electronic circuit 110, wherein the electronic circuit 110 may include at least on component of the following group of components: a resistor, a transistor (a field-effect transistor), a capacitor, an inductor, a diode, a wiring or conductive path, a carrier or a substrate. According to various embodiments, the electronic circuit 110 may include at least one of the following: an integrated circuit structure, a chip, a die, a microprocessor, a microcontroller, a memory structure, a logic circuit, a sensor, a nano-sensor, an integrated transceiver, a micro-mechanical system, a micro-electronic device, a nano-electronic device, an electrical circuit, a digital circuit, an analog circuit, and any other electronic device based on semiconductor technology.

According to various embodiments, the electronic circuit 110 may include a complementary metal oxide semiconductor circuit. According to various embodiments, the electronic circuit 110 may include an electronic circuitry provided in complementary metal oxide semiconductor technology. According to various embodiments, the electronic circuit 110 may be (or at least a part of) at least one of a microprocessor, a microcontroller, and a digital logic circuit e.g. provided in CMOS technology.

According to various embodiments, the electronic circuit 110 may include at least one of the following basic semiconductor technologies: MOS-technology (metal oxide semiconductor technology), nMOS-technology (n-channel MOS-technology), pMOS-technology (p-channel MOS-technology), CMOS-technology (complementary metal oxide semiconductor technology). According to various embodiments, the electronic circuit 110 may include a field effect transistor (FET) (e.g. a metal oxide semiconductor field effect transistor (MOSFET), a fin field effect transistor (FinFET), and/or a floating gate transistor.

According to various embodiments, the electrode structure 104 may be a part of a metallization layer 104 or metallization structure 104, e.g. a metallization layer 104 of the electronic circuit 110 or a metallization structure 104 to provide the functionality of the optoelectronic structure 108 and/or the optoelectronic device 108d, and/or the optoelectronic component 100.

According to various embodiments, since the optoelectronic structure 108 may be electrically conductively connected to the electrode structure 104, e.g. to enable the functioning of the optoelectronic device 108d, the grating structure 106 may be at least partially electrically conducting providing an electrically conductive connection between the electrode structure 104 and the optoelectronic structure 108.

According to various embodiments, the amorphous silicon included in the grating structure 106 may be doped, e.g. electron doped or hole doped. The amorphous silicon included in the grating structure 106 may be electrically conducting or at least semiconducting, such that the grating structure 106 may provide an electrical connection between the electrode structure 104 and the optoelectronic structure 108. The amorphous silicon included in the grating structure 106 may be in-situ doped, for example the amorphous silicon may be doped before being deposited over the electrode structure 104 or before the grating structure 106 is formed.

According to various embodiments, the metallization layer 104 or electrode structure 104 may provide the wiring for the electronic circuit 110 and/or an electrical connection between the electronic circuit 110 and the optoelectronic structure 108 via the grating structure 106. According to various embodiments, the metallization layer 104 or electrode structure 104 may include for example a patterned dielectric layer, e.g. including an electrically insulating material, e.g. a low-κ material, and a wiring including an electrically conductive material, e.g. aluminum and/or copper. According to various embodiments, the metallization layer 104 and/or the electrode structure 104 may be formed or at least partially formed by using aluminum etch technology.

Figure 4A:
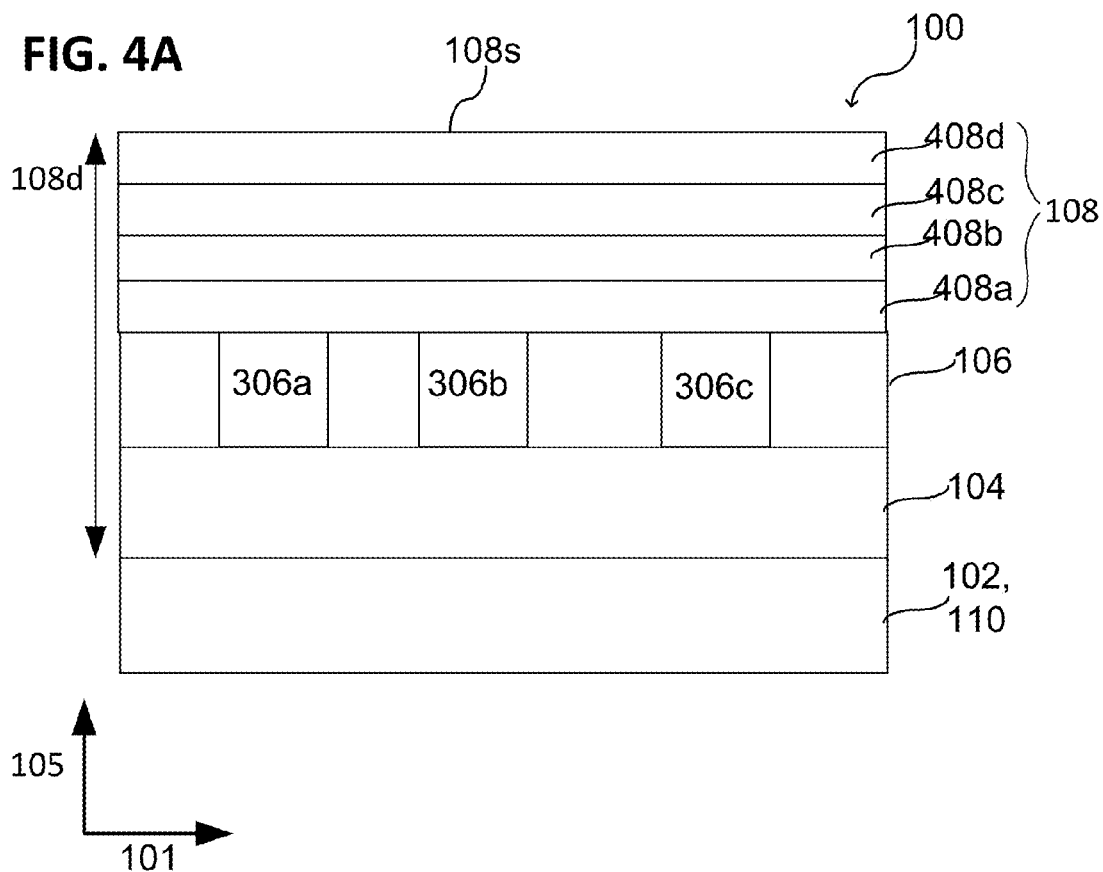
FIGS. 4A to 4C respectively show in a schematic cross sectional view or side view an optoelectronic component including an optoelectronic structure, according to various embodiments.
Figure 4B:
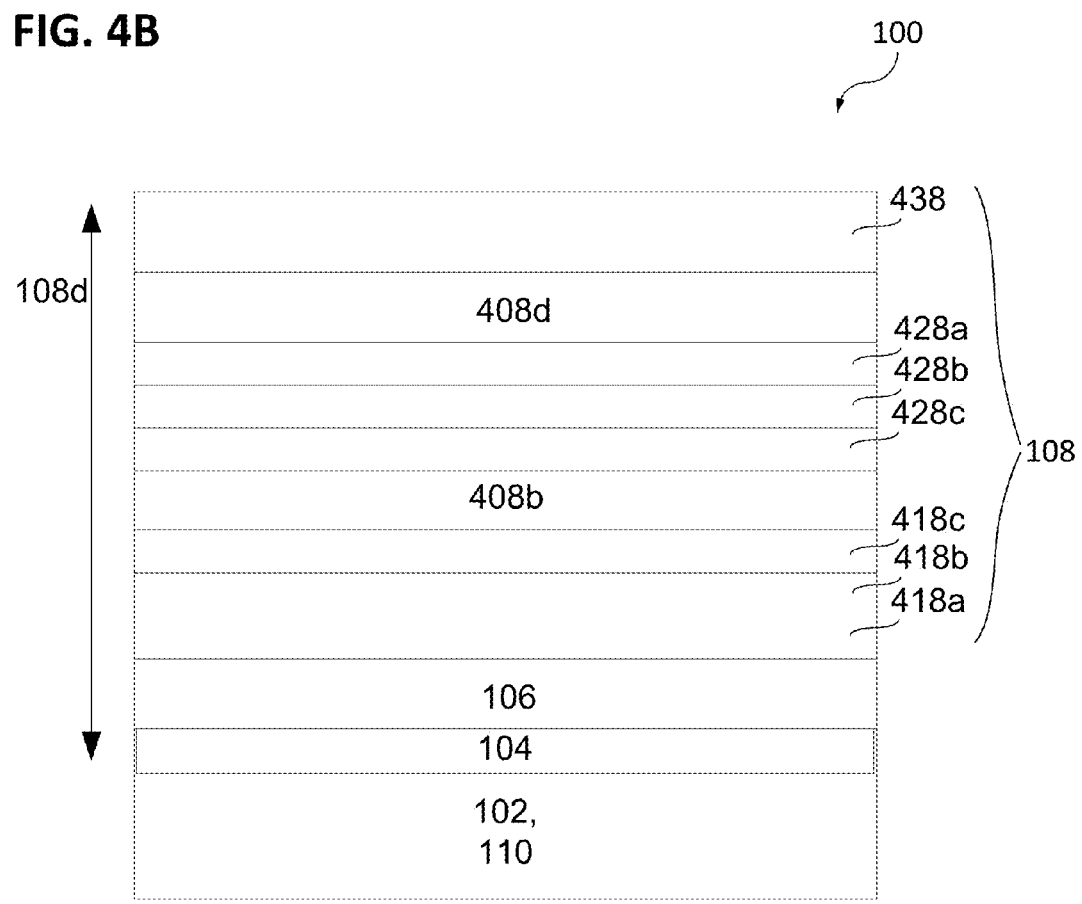
Figure 4C:
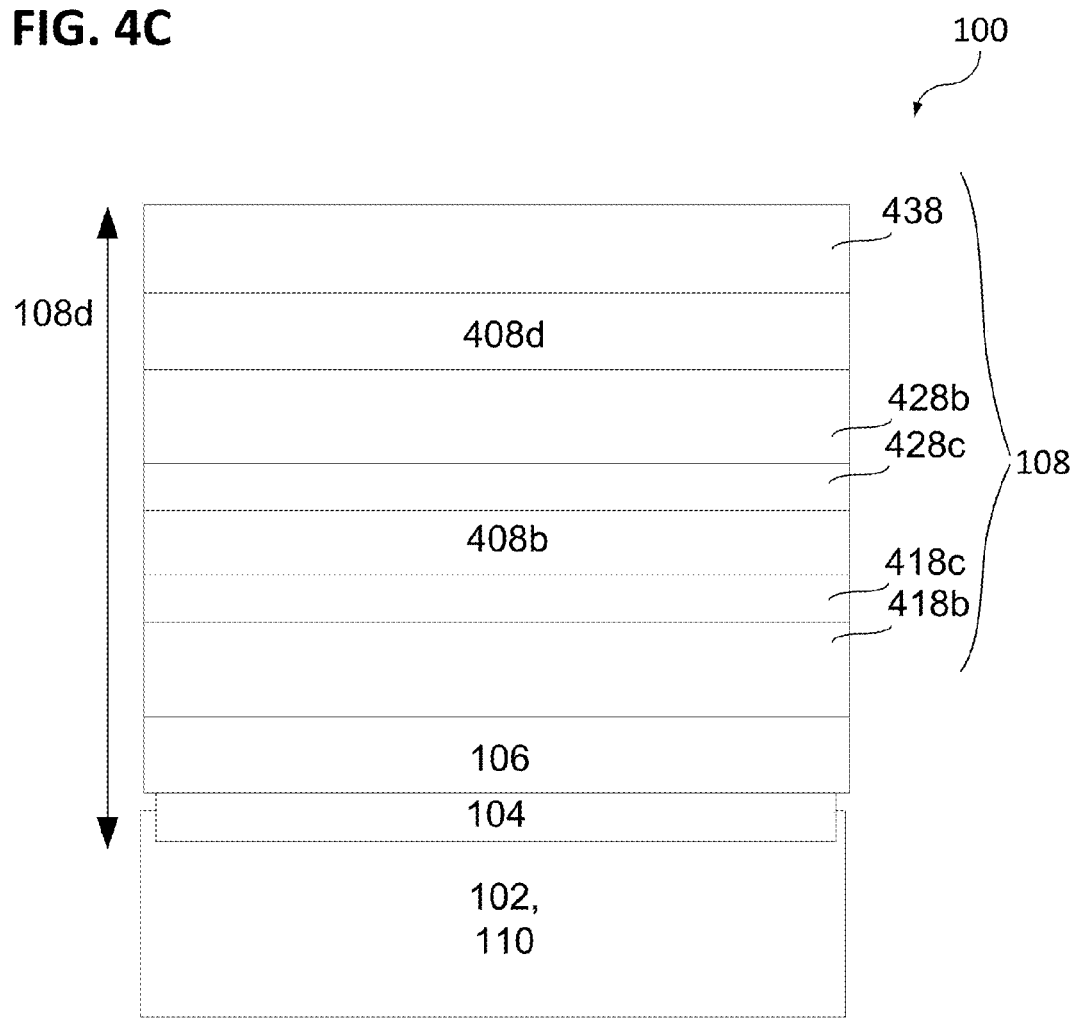

According to various embodiments, the optoelectronic structure 108 may be configured to provide an optoelectronic device selected from a group of optoelectronic devices consisting of: a light emitting device; a photovoltaic cell; and an optoelectronic sensor. According to various embodiments, the electrode structure 104 may be or may include a bottom electrode (e.g. a first electrode) for a light emitting device; a photovoltaic cell; and/or an optoelectronic sensor. According to various embodiments, the optoelectronic device 108d may be or may include at least one light emitting diode, or the optoelectronic structure 108 may provide a part of at least one light emitting diode. According to various embodiments, the optoelectronic structure 108 may include a plurality of light emitting diodes, or the optoelectronic structure 108 may provide a plurality of light emitting diodes. According to various embodiments, the optoelectronic device 108*d* and/or the optoelectronic structure 108 may be or may include at least one inorganic semiconductor material being configured as an electroluminescence layer or electroluminescence region, and the electrode 104 or the electrode structure 104 may provide a first electrode for the at least one light emitting diode, as shown in FIGS. 4A to 4C.

Figure 3A:
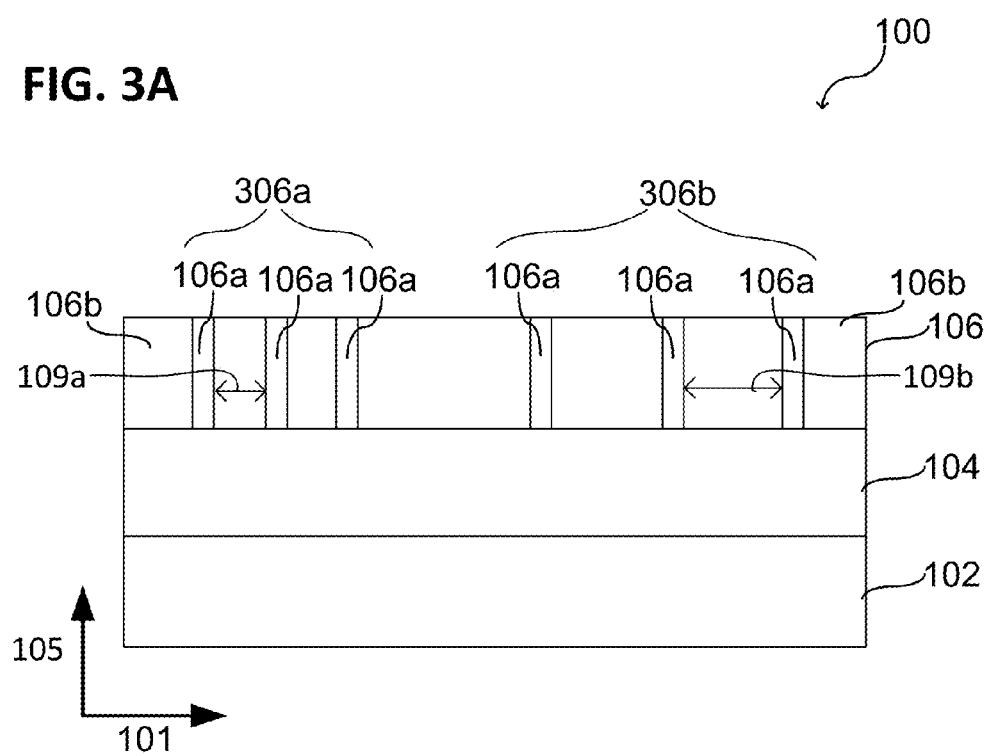
FIG. 3A schematically shows in a cross sectional view or side view an optoelectronic component, according to various embodiments.

FIG. 3A shows an optoelectronic component 100 including a grating structure 106, wherein the grating structure 106 may include a first grating 306*a* and a second grating 306*b*, wherein the design (e.g. the spacing 109*a*) of the first grating may be different from the design (e.g. the spacing 109*b*) of the second grating 306*b*. Illustratively, the gratings 306*a*, 306*b* may be respectively adapted to a wavelength of light to be influenced. This may allow providing optimal gratings 306*a*, 306*b* for different colors or for various different optoelectronic structures 108 disposed over the gratings 306*a*, 306*b*. According to various embodiments, the first grating 306*a* may have a smaller spacing 109*a* than the second grating 306*b*. The first grating 306*a* may be arranged over a first region of the carrier 102 and the second grating 306*b* may be arranged over a second region of the carrier 102, the second region of the carrier 102 being laterally displaced in relation to the first region of the carrier 102. As shown in FIG. 3A, the amorphous silicon regions 106*a* of the gratings 306*a*, 306*b* may extend (e.g. vertically) completely through the grating structure 106; and the amorphous silicon regions 106*a* of the gratings 306*a*, 306*b* may be laterally embedded and/or surrounded by another material having different optical properties than the amorphous silicon.

According to various embodiments, the grating structure 106 (the gratings 306*a*, 306*b*) may reflect light, e.g. partially. Further, the grating structure 106 may scatter incident light.

Figure 3B:
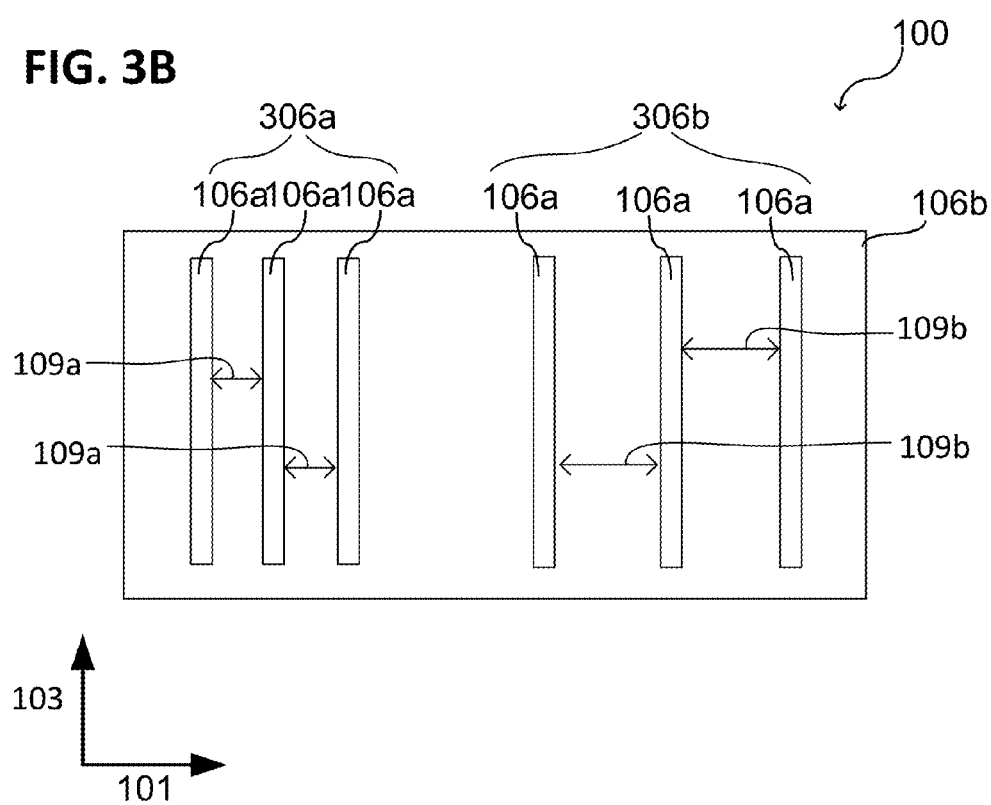
FIGS. 3B and 3C respectively show in a schematic top view or cross sectional view an optoelectronic component, e.g. related to FIG. 3A, according to various embodiments.

As shown in FIG. 3B in a top view corresponding to the schematic side view or cross sectional view illustrated in FIG. 3A, the amorphous silicon of the gratings 306*a*, 306*b* or the amorphous silicon regions 106*a* of the gratings 306*a*, 306*b* may form a grid (e.g. a line grid) with the respective spacing 109*a*, 109*b*. The grating structure 106 may be modified to provide other grid structures or other symmetric structures being able functioning as an optical grating.

According to various embodiments, the amorphous silicon regions 106*a* of the gratings 306*a*, 306*b* may have a width (lateral extension along the direction 101) in the range from about 150 nm to about 250 nm, e.g. in the range from about 190 nm to about 210 nm. According to various embodiments, the spacing 109*a*, 109*b* may be in the range from about 150 nm to about 250 nm, e.g. in the range from about 190 nm to about 210 nm, e.g. in the range from about 100 nm to about 400 nm.

Figure 3C:
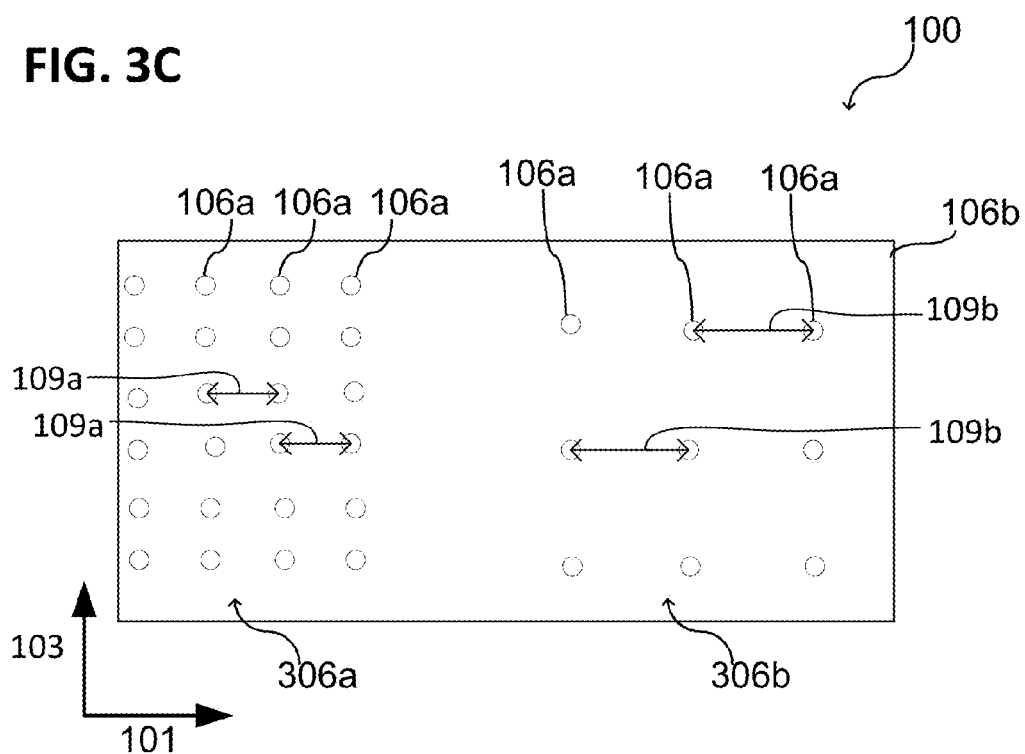

Alternatively, as shown in FIG. 3C in a top view corresponding to the schematic side view or cross sectional view illustrated in FIG. 3A, the grating structure 106 may be configured as an array of regions 106*a*. Thereby, the optical properties of the grating structure 106 may be defined by the spacing 109*a*, 109*b* and the shape of the lattice (the specific arrangement) of the optical structure elements 106*a*. The shape of the regions 106*a* including amorphous silicon may be chosen as desired, e.g. the regions 106*a* forming the grating structure 106 may have a prismatic shape, a cylindrical shape, a cuboidal shape, and the like.

Alternatively, according to various embodiments, the amorphous silicon regions 106*a* of the gratings 306*a*, 306*b* may be provided by an amorphous silicon layer 106 including a plurality of holes, the holes may have a diameter (width) in the range from about 200 nm to about 550 nm, or e.g. from about 300 nm to about 400 nm, wherein the distance (e.g. edge to edge) between adjacent holes may be in the range from about 90 nm to about 120 nm, e.g. the spacing 109*a*, 109*b* (e.g. center to center) of the hole arrangement of the plurality of holes may be in the range from about 400 nm to about 550 nm, or e.g. from about 400 nm to about 500 nm. The holes 106*a* of the plurality of holes may be filled with a material having a refractive index different from the refractive index of amorphous silicon, e.g. with silicon oxide (SiO$_2$).

According to various embodiments, a plurality of different gratings, as described herein, may be processed on the very same wafer or carrier.

FIG. 4A shows an optoelectronic component 100 including an optoelectronic structure 108 disposed over the grating structure 106, the grating structure 106 may include for example a first grating 306*a*, second grating 306*b*, and a third grating 306*c*. The gratings 306*a*, 306*b*, 306*c* may have any desired design, as described above, being able to serve as optical grating. The optoelectronic structure 108 may include: a second electrode structure 408*d* (e.g. one or more top electrodes, e.g. a transparent top electrode structure 408*d*), a light emitting layer 408*b*, a first charge transport layer 408*a* and a second charge transport layer 408*c*. The electrode structure 104, the grating structure 106 and the optoelectronic structure 108 may together form an optoelectronic device 108*d*, as already described.

Further, according to various embodiments, the optoelectronic device 108*d* may include a plurality of single electrodes, e.g. a plurality of first electrodes of the first electrode structure 104 and a plurality of second electrodes of the second electrode structure 408*d*. According to various embodiments, the first electrode structure 104 and/or the second electrode structure 408*d* may be transparent or at least partially transparent to light being for example generated in the light emitting layer 408*b* of the optoelectronic structure 108.

According to various embodiments, the optoelectronic structure 108 may be configured to provide an LED array including a plurality of light emitting diodes being controlled by the electronic circuit 110. According to various embodiments, the at least one light emitting diode may be a green emitting LED, a red emitting LED, a blue emitting LED, an orange emitting LED, a yellow emitting LED, a violet emitting LED, or an LED emitting any other possible color. According to various embodiments, the at least one light emitting diode may be a phosphor converted LED, e.g. a phosphor converted blue LED or ultra violet LED (UV-LED). According to various embodiments, the at least one light emitting diode may include at least one material of the following group of materials providing the electroluminescence material: Gallium(III) phosphide (GaP), Aluminum gallium indium phosphide (AlGaInP), Aluminum gallium phosphide (AlGaP), Indium gallium nitride (InGaN), Gallium(III) nitride (GaN), Gallium arsenide (GaAs), Aluminum gallium arsenide (AlGaAs).

According to various embodiments, the at least one light emitting diode may include an additional electrode 408*d* (a second electrode 408*d*), wherein the electrode 104 may be a bottom electrode 104 and the second electrode 408*d* may be a top electrode 408*d*. According to various embodiments, the second electrode 408*d* may be transparent for the light emitted from the optoelectronic structure 108 (or the additional electrode may be at least partially transparent to specific wavelengths being emitted from the optoelectronic structure 108), wherein the optoelectronic structure 108 may include an electroluminescence layer 408b being arranged between the bottom electrode 104 and the transparent second electrode 408d.

According to various embodiments, a transparent second electrode 408d may include a transparent electrically conductive oxide (TCO), e.g. tin-doped indium oxide (ITO), e.g. aluminum-doped zinc oxide (AZO), e.g. indium-doped cadmium oxide (ICO). According to various embodiments, the transparent top electrode 408d (e.g. a TCO layer) may be formed (e.g. deposited) using a chemical vapor deposition (CVD) process or a physical vapor deposition (PVD) process, e.g. metal organic chemical vapor deposition (MOCVD), metal organic molecular beam deposition (MOMBD), atomic layer deposition, molecular beam epitaxy (MBE), an atomic layer CVD process (ALCVD), spray pyrolysis, pulsed laser deposition (PLD), sputtering, magnetron sputtering, DC-sputtering, AC-sputtering.

According to various embodiments, the optoelectronic structure 108 may be configured to provide an organic light emitting diode. In this case, the electroluminescence layer 408b, which may generate light, may include an organic material, e.g. a polymer or small organic molecules. Further, the at least one organic light emitting diode 108d may include functional layers or a functional layer stack 108, e.g. charge carrier injection layers for electron injection and/or hole injection, charge transport layers for electron transport and/or hole transport, barrier layers configured as electron blocking layer or hole blocking layer, and other transfer layers, e.g. to adapt the electronic properties of the layers and the material, e.g. to change work functions and band structures (c.f. FIG. 4BA and FIG. 4C).

According to various embodiments, the organic light emitting diode 108d may include at least a first electrode 104 and a second electrode 408d, wherein the electroluminescence layer 408b may be arranged between the first and the second electrode. According to various embodiments, one of the electrodes included in the organic light emitting diode 108d may be transparent to the emitted light, wherein the other electrode of the electrodes may be configured to be highly reflective (to be a mirror). Therefore, a first electrode 104 may be configured, as described herein referring to the electrode structure 104, to reflect the light emitted from the electroluminescence layer 408b. The second electrode 408d may include for example a transparent electrically conductive oxide (TCO), such that light may be emitted from the electroluminescence layer 408b to the environment, e.g. through the surface 108s of the optoelectronic structure 108. Depending on the arrangement of the mirror electrode 104 and the second transparent electrode 408d, the organic light emitting diode 108d may be a bottom-emitting organic light emitting diode or a top-emitting organic light emitting diode. Referring to this, in case the light emitting diode 108d may be a bottom emitting diode the carrier 102 may be transparent as well. In case the light emitting diode 108d may be a top emitting diode, the carrier 102 may include an electronic circuit 110.

According to various embodiments, an optoelectronic component 100 may include a plurality of organic light emitting diodes 108d, e.g. arranged in a regular array, wherein the organic light emitting diode arrangement may be controlled via the underlying electronic circuit 110, as described above. In other words, the optoelectronic component 100 may be configured as an organic light emitting diode display device.

According to various embodiments, the optoelectronic component 100 may include a plurality of organic light emitting diodes having various colors, e.g. depending on the configuration of the electroluminescence layer 408b, e.g. the used polymers or molecules. According to various embodiments, the optoelectronic component 100 may include a plurality of organic light emitting diodes having various colors providing white light, e.g. used as an OLED backlight for a display device. According to various embodiments, the plurality of organic light emitting diodes may have substantially the same color, wherein the optoelectronic component 100 may in this case further include a color filter layer, e.g. to provide the desired different colors. According to various embodiments, a color filter layer may include at least one phosphorescent or fluorescent material.

According to various embodiments, the electrode 104 may provide the basis for an optoelectronic layer stack 108 being formed over the electrode 104, wherein the optoelectronic layer stack 108 and the electrode 104 may for example provide a light emitting electronic device 108. In this case, the electrode 104 may function as a mirror layer and an electrode for the light emitting electronic device. Using the grating structure 106, as described above, may enhance the efficiency of a light emitting optoelectronic component 100, or light emitting optoelectronic structure 108, since the optical properties of the gratings or the grating structure 106, as described above, may be beneficial increase the possible amount of light being emitted through the upper surface 108s of the optoelectronic structure 108. The grating structure 106 may change the light scattering behavior within the optoelectronic structure 108 and may increase the outcoupling efficiency of the optoelectronic device 108d.

Further, according to various embodiments, providing a smooth primary layer or a smooth layer (e.g. the grating structure 106 may be polished) may enable the precise control of the layer thicknesses of the functional layers (e.g. of the optoelectronic layer stack 108) of the light emitting structure deposited on top of the smooth primary layer. According to various embodiments, a smooth grating structure 106 may allow depositing layers having a larger thickness on top of the grating structure 106 having a sufficient high quality (roughness and microstructure). Therefore, the efficiency of a light emitting electronic device (e.g. OLED) may be enhanced, since each of the functional layers in the OLED layer stack may be formed with the optimal thickness as desired. In other words, a small surface layer roughness of the grating structure 106 may reduce the necessary layer thickness of one or more layers being deposited on top of the grating structure 106 and/or may increase the quality of the grown layers.

According to various embodiments, the electrode structure 104 being formed on top of the carrier 102 or on top of the electronic circuit 110 may include one or more additional electrode layers, e.g. influencing the reflectivity and the electronic properties, e.g. work functions, of the light emitting structure 108.

FIG. 4B shows a schematic view of an optoelectronic device 108d, wherein an optoelectronic layer stack 108 may be disposed over the electrode 104 and the grating structure 106 thereby forming the optoelectronic device 108d (e.g. for providing the functionality of the optoelectronic component 100). The optoelectronic device 108d including the optoelectronic layer stack 108, the grating structure 106, and the electrode 104 may be a disposed over the carrier 102 respectively in direct mechanical contact with each other. The electrode 104, as described herein, may provide the bottom electrode of the light emitting device, the electrode 104 providing a first type of charge carriers and the layer 408d of the optoelectronic layer stack 108 may provide a second electrode providing a second type of charge carriers.

According to various embodiments, the optoelectronic layer stack 108 may further include at least one electroluminescence layer 408b (or recombination layer 408b), wherein the first type of charge carriers provided by the electrode 104 and the second type of charge carriers provided by the top electrode 408d may recombine under emission of light.

According to various embodiments, the first type of charge carriers may be holes and the second type of charge carriers may be electrons. In this case, the electrode 104 may be an anode and the second electrode 408d may be a cathode. According to another embodiment, the first type of charge carriers may be electrons and the second type of charge carriers may be holes. In this case, the electrode 104 may be a cathode and the second electrode 408d may be an anode.

According to various embodiments, one of the electrodes 104, 408d may be transparent to light, wherein the other electrode of the electrodes 104, 408d may be configured to be highly reflective to light (to be a mirror). According to various embodiments, the first electrode 104 may be configured as described herein, reflecting light generated within the optoelectronic structure 108. A second electrode may include for example an electrically conductive oxide (TCO) being substantially transparent to light, as already described.

According to various embodiments, the electrode 104 may be the bottom (mirror) electrode 104 and the second electrode 408d may provide the (transparent) top electrode. According to various embodiments, the second electrode 108b may be transparent to the light emitted from the electroluminescence layer 408b (or at least partially transparent to the specific wavelengths being emitted from the electroluminescence layer 408b), such that the optoelectronic component 100 may be configured as a top emitting light emitting diode.

According to various embodiments, the electroluminescence layer 408b may include or may be an inorganic light emitting layer, e.g. a semiconductor material including the desired band structure for emitting light while electrons and holes recombine within the electroluminescence layer 408b. According to various embodiments, the inorganic light emitting layer may include at least one material of the following group of materials: Gallium(III) phosphide (GaP), Aluminum gallium indium phosphide (AlGaInP), Aluminum gallium phosphide (AlGaP), Indium gallium nitride (InGaN), Gallium(III) nitride (GaN), Gallium arsenide (GaAs), Aluminum gallium arsenide (AlGaAs).

According to various embodiments, the electroluminescence layer 408b may include or may be an organic light emitting layer, e.g. an organic material including the desired band structure for emitting light while electrons and holes recombine within the electroluminescence layer 408b. According to various embodiments, the electroluminescence layer 408b may be arranged between the first electrode 104 and the second electrode 408d, as shown in FIG. 4B. According to various embodiments, the organic light emitting diode 108d may be configured as a top emitting organic light emitting diode. According to various embodiments, the electroluminescence layer 408b may be a layer stack including more than one electroluminescence layer. According to various embodiments, the electroluminescence layer stack may include at least to organic materials emitting light in a different color (or wavelength) range.

According to various embodiments, the organic light emitting layer 408b may include at least one material of the following group of materials: small molecules (e.g. N,N'-Bis(3-methylphenyl)-N,N'-bis(phenyl)-benzidin or thieno[3,4-c]pyrrole-4,6-dione (TPD), Nitrile Butadiene Polymer (NBP), Aluminum-tris(8-hydroxychinolin) (Alq3), Biphen) and/or polymers (e.g. Poly(p-phenylen-vinylen) PPV or PPV derivate, Poly[2-methoxy-5-(2'-ethylhexyloxy)-p-phenylene vinylene] (MEH-PPV), Poly(1,4-phenylen) (PPP), substituted PPP, Poly(9,9'-dioctlyfluorene)) and derivate and/or substitutions of said material.

According to various embodiments, the optoelectronic layer stack 108 shown in FIG. 4B may optionally include additional functional layers, as for example charge carrier injection layers 418a, 428a, charge carrier transport layers 418b, 428b, and/or charge carrier blocking layers 418c, 428c (so called blocking layers). These additional functional layers may enhance the properties of the OLED 108d or the OLED layer stack 108.

According to various embodiments, in case the OLED layer stack 108 may be configured to provide a top emitting OLED, the electrode 104 may be the anode providing holes as charge carriers, the carrier injection layer 418a may be a hole injection layer 418a and the charge carrier transport layer 418b may be a hole transport layer 418b, wherein the charge carrier blocking layer 418c may be an electron blocking layer 418c. Further, the electrode 408d may be the cathode providing electrons as charge carriers, the carrier injection layer 428a may be an electron injection layer 428a and the charge carrier transport layer 428b may be an electron transport layer 428b, wherein the charge carrier blocking layer 428c may be a hole blocking layer 428c.

According to various embodiments, the hole transport layer 418b and the hole injection layer 418a may include at least one material of the following group of materials: NPB, TPD, or derivatives of NBP and TPD. According to various embodiments, electron transport layer 428b and the electron injection layer 428a may include at least one material of the following group of materials: FPF-BIm4, PFN-BIm4, Alga, oxadiazole molecule (2-(4-biphenyl)-5-(4-tert-butylphenyl)-1,3,4-oxadiazole (PBD), 2,5-bis(4-naphthyl)-1,3,4-oxadiazole (BND), PBD in a poly(methyl methacrylate) (PMMA) matrix.

According to various embodiments, there may be a huge number of possible organic or metal organic materials which may be used as charge carrier injection layers 418a, 428a, charge carrier transport layers 418b, 428b, and/or charge carrier blocking layers 418c, 428c.

According to various embodiments, the optoelectronic layer stack 108 shown in FIG. 4B may include a capping layer 438 on top of the optoelectronic layer stack 108 or as top layer of the optoelectronic layer stack 108, e.g. to protect the layer stack from environmental influences. Since the optoelectronic layer stack 108 may be a top emitting light emitting device, the capping layer 438 may be transparent to the light being emitted from the electroluminescence layer 408b.

According to various embodiments, the highly reflective metallic electrode 104 may provide the primary layer of the grating structure 106 and the OLED structure 108 formed over the grating structure 106. Therefore, providing a high quality (e.g. a smooth and dense) electrode may enhance the functionality (e.g. the efficiency and/or the stability) of the OLED layer stack 108 and providing a high quality (e.g. a smooth and dense) grating structure 106 may enhance the functionality of the OLED layer stack 108.

According to various embodiments, the organic materials formed over the grating structure 106 may be applied by using a CVD process or a PVD process, or e.g. spin-coating, printing, and the like.

According to various embodiments, the carrier 102 of the optoelectronic component 100 may include a complementary metal-oxide-semiconductor (CMOS) structure providing an integrated circuit. According to various embodiments, the integrated circuit may enable the control of the OLED 108d or the OLED structure 108 formed over the integrated circuit.

The OLED 108d including the OLED layer stack 108, the grating structure 106, and the bottom electrode 104 may be formed over a metallization structure 104, and the efficiency of the OLED 108d may depend on the morphology of the grown functional layers of the layer stack 108. The functional layers (418a, 418b, 418c, 408b, 428a, 428b, 428c, 408d, 438) of the layer stack 108 may include at least one of an additional metallic contact layer at the bottom of the OLED 108d (not shown), a hole transport layer (providing the electrical transport of the holes from an anode to the electroluminescent layer), an electroluminescent layer (generating light due to recombination of electrons and holes within the electroluminescent layer), an electron transport layer (providing the electrical transport of the electrons from a cathode to the electroluminescent layer), an electron blocking layer (preventing and/or hindering electrons reaching the anode), a hole blocking layer (preventing and/or hindering holes reaching the cathode). According to various embodiments, the out-coupled intensity of the light provided by an OLED on a CMOS-structure may be proportional to the reflectance of the metallic contact electrode 104 at the bottom side of the OLED and/or the optical properties of the grating structure 106. Besides the high reflectance, a very low surface roughness (e.g. smaller than 3 nm RMS) of the electrode structure 104 may be compulsory as for example a larger roughness may yield electrical field filaments in the hole transport layer (HTL) of the OLED and may cause subsequent degradation and/or an early fail of the optoelectronic component 100. Therefore, the electrode structure 104 may not be subjected to high temperatures, e.g. larger than 500° C., since the electrode structure 104 may degrade, e.g. due to recrystallization effects and/or diffusion. Therefore, the grating structure 106 may be formed at temperatures smaller than about 500° C.

According to various embodiments, the electrode 104 may include at least one of the following layers or layer stacks: a gold layer, a silver layer, a nickel-phosphorous layer (NiP), and a palladium layer. According to various embodiments, the electrode 104 may a part of an OLED or OLED layer stack. According to various embodiments, the electrode 104 may a part of an OLED or OLED layer stack disposed on a metallization structure 104 of an integrated circuit (CMOS). According to various embodiments, the electrode 104 may be a highly reflective metallic contact layer e.g. for an organic light emitting diode. According to various embodiments, the electrode 104 may be an electrically conductive electrode, e.g. for an organic light emitting diode.

FIG. 4C shows a modified OLED 108d, including at least an anode 104 (electrode 104), a hole transport layer 418c being p-type doped, an emissive layer (e.g. emitting light), an electron transport layer 428b being n-type doped, and a cathode 408d. According to another embodiment, the OLED 108d may include at least a cathode 104 (electrode 104), an electron transport layer 418b being n-type doped, an emissive layer 408b (e.g. emitting light), a hole transport layer 428b being p-type doped, and an anode 408d. According to various embodiments, the OLED layer stack 108 may further include an electron blocking layer and a hole blocking layer, (e.g. layer 418c and layer 428c as already described).

According to various embodiments, the p-type hole transport layer may include at least one material of the following group of materials: MTDATA, MeO-TPD, NPB, 2TNATA. According to various embodiments, the p-type hole transport layer may be doped by using at least one material of the following group of materials: $F_4TCNQ$, $WO_3$, $MoO_3$, and $V_2O_5$.

According to various embodiments, the n-type electron transport layer may include at least one material of the following group of materials: Bphen (Bphen 4, 7-diphenyl-1, 10-phenanthroline) and BCP (Bathocuproine). According to various embodiments, the n-type electron transport layer may be doped by using at least one material of the following group of materials: Li, Cs, and $Cs_2Co_2$.

According to various embodiments, the emissive layer 108a may include at least one material of the following group of materials:
IrPPy (Iridium, tris[2-(2-pyridinyl-κN)phenyl-κC]),
TCTA (Tris(4-carbazoyl-9-ylphenyl)amine), TCTA:IrPPy,
CBP (4,4'-N,N'-dicarbazole-biphenyl), CBP:IrPPy, TCTA:IrPPy/CBP:IrPPy, and
TCTA:IrPPy/TAZ:IrPPy, According to various embodiments, the hole blocking layer may include at least one material of the following group of materials: BCP, TPBi, Pphen.

According to various embodiments, the electron blocking layer may include at least one material of the following group of materials:
Spiro-TAD (2,2',7,7'-Tetrakis(diphenylamino)-9,9'-spirobifluorene),
TAPC (Di-[4-(N,N-ditolyl-amino)-phenyl]cyclohexane).

According to various embodiments, the electrode 104, the grating structure 106 and/or the optoelectronic layer stack 108 may be formed by using a standard layering process in semiconductor industry, e.g. at least one of a physical vapor deposition process and a chemical vapor deposition process.

According to various embodiments, a layer of an organic semiconductor may be formed by using at least one of the following processes: physical vapor deposition, chemical vapor deposition, and spin-coating from a solution. Further the formed layer of an organic semiconductor may have polycrystalline morphology, nanocrystalline morphology, or an amorphous morphology. According to various embodiments, polycrystalline morphology and nanocrystalline morphology may include a plurality of crystallites, wherein the crystallites of the plurality of crystallites may have substantially a random orientation distribution. In other words, the crystallographic orientation of the crystallites may have a random spatial distribution.

FIG. 5 shows a schematic flow diagram of a method 500 for processing a carrier 102, the method may include: in 510, providing a carrier 102, the carrier 102 including an electrode structure 104 (e.g. one or more electrodes); in 520, forming a layer over the electrode structure, the layer including amorphous silicon; in 530, patterning the amorphous silicon layer to provide one or more recesses (e.g. a recess structure); and filling the one or more recesses of the patterned amorphous silicon layer with a material having a different refractive index than the refractive index of the amorphous silicon (e.g. to provide a grating over the electrode structure).

Further, a method for manufacturing an optoelectronic component may include forming a grating structure on top of a metal electrode, the grating structure including amorphous silicon regions being at least partially embedded into a material having a refractive index different from the refractive index of amorphous silicon.

In the following FIGS. 6A to 6E, a carrier 102 is illustrated after various processing stages during the processing, e.g. during the manufacture of an optoelectronic component 100, e.g. during method 500 is carried out.

Figure 6A:
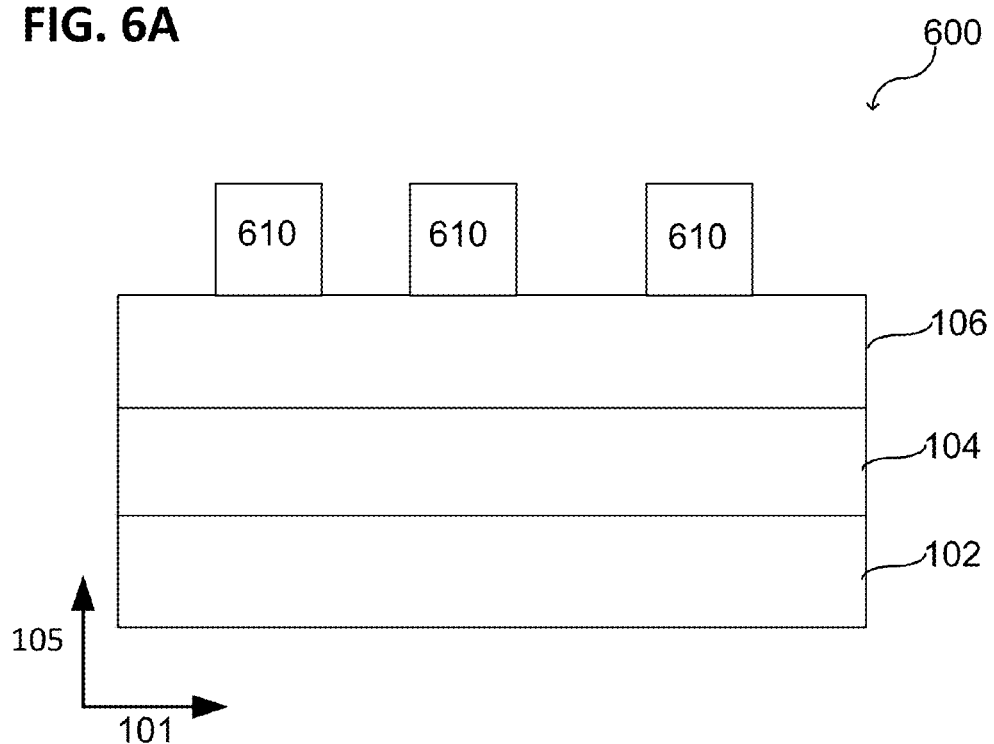

As shown in FIG. 6A, an amorphous silicon layer 106 may be deposited over an electrode structure 104 on a carrier 102, in analogy as described before. The amorphous silicon layer 106 may include at least one of the following modifications of amorphous silicon (a-Si): hydrogenated amorphous silicon (a-Si:H), doped amorphous silicon (p-doped a-Si or n-doped a-Si), doped hydrogenated amorphous silicon, or amorphous silicon containing other impurities or dopants, e.g. a metal. However, the crystal structure of the amorphous silicon bases for example on an absence of a long range order.

Further, as illustrated in FIG. 6A, a patterned mask layer 610 (or one or more masking regions 610) may be formed over the amorphous silicon layer 106. The patterned mask layer 610 may include a patterned hard mask layer or a patterned soft mask layer. The patterned mask layer 610 may be configured to enable a patterning of the amorphous silicon layer 106.

According to various embodiments, the carrier 102 may include an electronic circuit being formed using semiconductor technology, wherein the carrier may further include a metallization layer being formed over the carrier 102 using a metallization process, as already described.

Figure 6B:
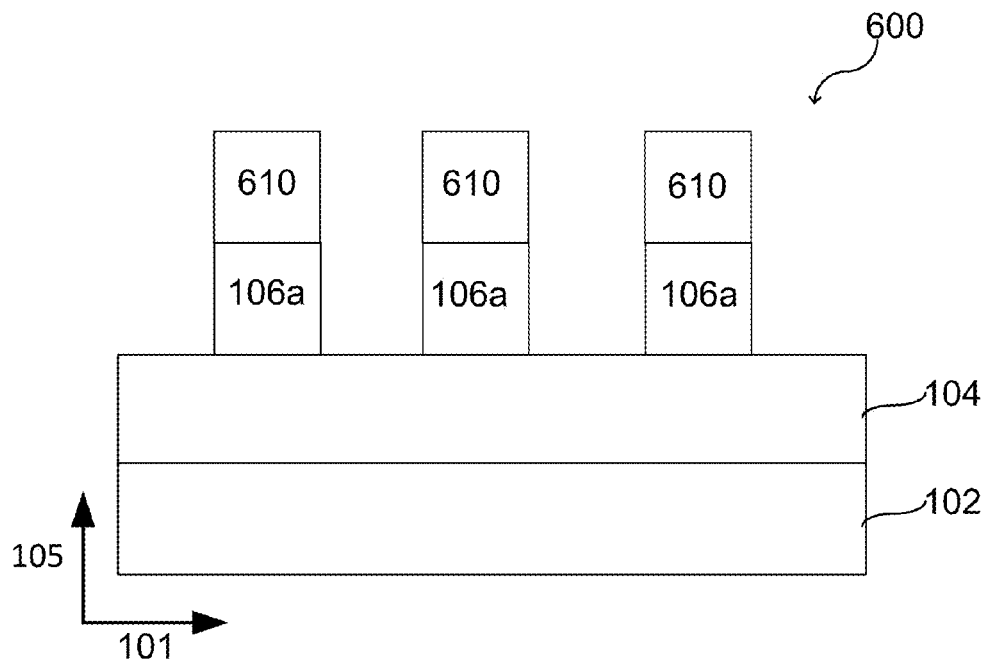

As shown in FIG. 6B, the amorphous silicon layer 106 may be patterned, e.g. via an anisotropic etch process, e.g. via reactive ion etching (RIE), thereby, a plurality of first regions 106a may be provided, the regions of the plurality of first regions 106a may include amorphous silicon. Illustratively, the amorphous silicon layer 106 may be subjected to a patterning process, as described herein, wherein the pattern of the patterned mask layer 610 may define the pattern of the grating structures 106a.

According to various embodiments, a plurality of recesses may be formed in the amorphous silicon layer 106 via the patterning. The plurality of recesses and the remaining structure elements between the recesses may provide a part of the grating structure 106.

Figure 6C:
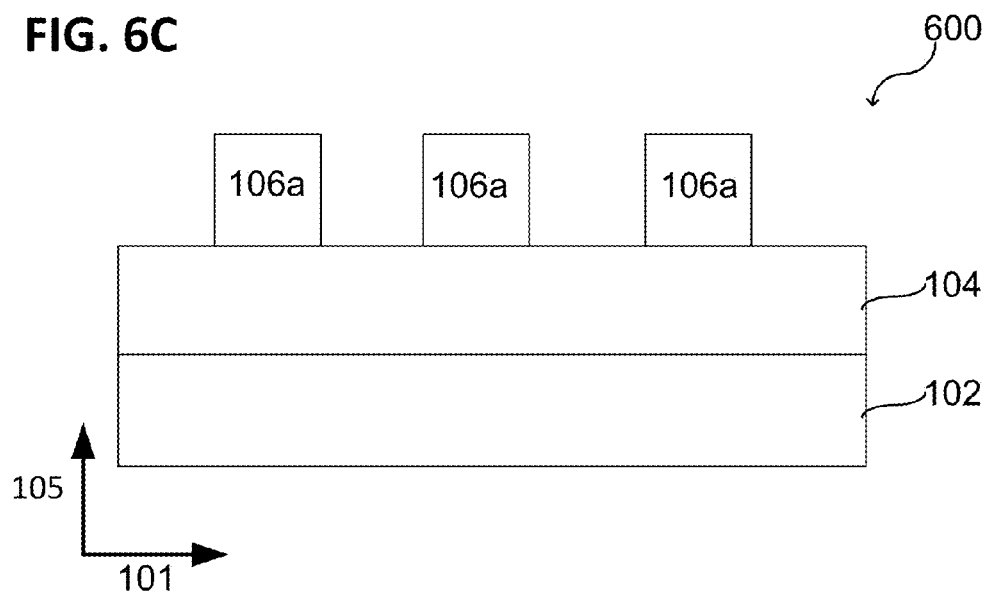

As shown in FIG. 6C, the patterned mask layer 610 may be removed. In case the patterned mask layer 610 is a patterned soft mask (e.g. including a resist), the patterned mask layer 610 may be removed via a plasma chemical treatment (plasma cleaning using oxygen) or the patterned mask layer 610 may be chemically removed via a solvent. In case the patterned mask layer 610 is a hard mask, the hard mask material may be removed via carrying out a selective etch process.

Figure 6D:
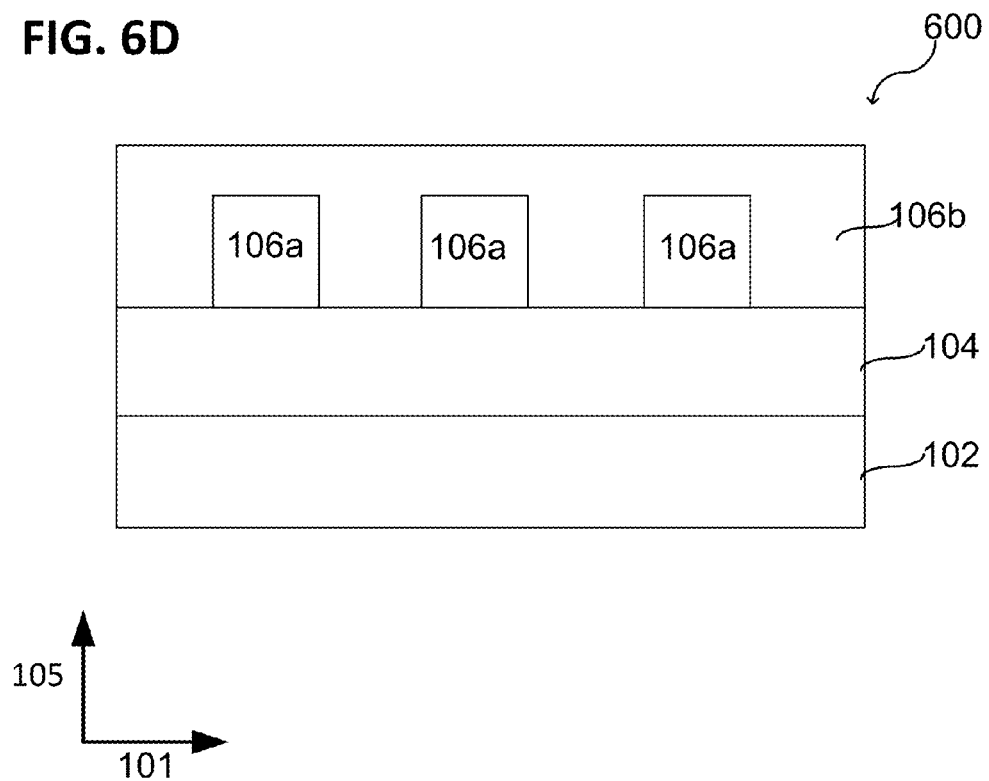

As shown in FIG. 6D, a material layer 106b may be deposited over the patterned amorphous silicon layer 106 (over the grating structure 106). The material of the material layer 106b may fill the regions between the respective amorphous silicon regions 106a of the grating structure 106 (partially or completely). Further, the amorphous silicon regions 106a may be surrounded at least laterally from the material of the material layer 106b or the amorphous silicon regions 106a may be may be embedded into the material of the material layer 106b. The material layer 106b may include or may consist of silicon oxide, or another suitable material, as described before. The material layer 106b may be deposited using a conformal deposition process. The material layer 106b may be deposited using LPCVD. Further, the material layer 106b may have a smaller or larger refractive index than the amorphous silicon in the amorphous silicon regions 106a (e.g. with a difference in the refractive index in the range from about 0.5 to about 4), such that the material layer 106b and the amorphous silicon regions 106a may provide an optical grating 106.

As illustrated in FIG. 6E, a planarization process may be carried out (e.g. CMP) removing the previously deposited material layer 106b partially, e.g. thereby exposing the amorphous silicon regions 106a at the upper surface of the grating structure 106. Further, the surface 106s of the grating structure 106 may be smooth, e.g. having an RMS-roughness of smaller than about 3 nm.

FIG. 7 illustrates an optoelectronic component 100 including a grating structure 106, the grating structure 106 including different gratings 306a, 306b, 306c being respectively disposed over an electrode 104a, 104b, 104c of an electrode structure 104. The electrodes 104a, 104b, 104c or the electrode structure 104 may include an electrode layer stack 704a, 704b, 704c including a first electrode layer 704a (e.g. including titanium nitride), a second electrode layer 704b (e.g. including aluminum), and a third electrode layer 704c (e.g. including titanium nitride). However, the electrode layer stack 704a, 704b, 704c may include other material layers being suitable for providing an electrode, e.g. metals or doped semiconductors.

The grating structure 106 may include a plurality of grating structure elements 106a, e.g. regions 106a including amorphous silicon. Further, the grating structure 106 may include a material 106b or a region 106b including a material other than amorphous silicon such that the regions 106a and regions 106b may form or provide an optical grating 106, as already described.

According to various embodiments, an optoelectronic component may include: an electrode structure disposed at least one of over and in a carrier; and a grating structure disposed over the electrode structure, the grating structure including at least a first region and a second region, wherein the first region of the grating structure may include amorphous silicon; and wherein the second region of the grating structure may include a material having a refractive index different from the refractive index of the amorphous silicon.

According to various embodiments, the optoelectronic may include an optoelectronic structure is disposed over the grating structure.

According to various embodiments, the optoelectronic structure may be configured to provide an optoelectronic device selected from a group of optoelectronic devices, the group consisting of: a light emitting device; a photovoltaic cell; and an optoelectronic sensor.

According to various embodiments, the optoelectronic structure may be configured to provide at least one light emitting diode.

According to various embodiments, the optoelectronic structure may be configured to provide at least one organic light emitting diode.

According to various embodiments, the amorphous silicon may be doped.

According to various embodiments, the amorphous silicon may be electrically conductive (metallically conductive).

According to various embodiments, the amorphous silicon of the grating structure may be doped to electrically conductively connect the optoelectronic structure and the electrode structure with each other.

According to various embodiments, the carrier may include an electronic circuit. According to various embodiments, the carrier may include an integrated circuit.

According to various embodiments, at least a part of the electronic circuit may be configured as a driver circuit for an optoelectronic structure.

According to various embodiments, the electrode structure may be a part of a metallization being disposed over the carrier.

According to various embodiments, the electrode structure may include one or more electrically conductive electrodes. According to various embodiments, the electrode structure may be configured as electrically routing layer or as a metallization layer structure.

According to various embodiments, the one or more electrically conductive electrodes of the electrode structure may include a metal, having for example a melting point of smaller than about 700° C. According to various embodiments, the one or more electrically conductive electrodes of the electrode structure may include aluminum, wherein aluminum may recrystallize, diffusion, and/or increase the surface roughness if the electrode structure may be subjected to a temperature larger than about 500° C. or larger than about 550° C.

According to various embodiments, the grating structure may include a first grating and a second grating, wherein the second grating has a different design than the first grating.

According to various embodiments, the grating structure may include a plurality of gratings, wherein at least two gratings of the plurality of gratings have different designs, e.g. a different spacing, a different optical spacing, or different optical properties.

According to various embodiments, an optoelectronic component may include: a metallization structure disposed over a carrier, the metallization structure including at least one contact pad (electrode); one or more grating structures being disposed over the at least one contact pad of the metallization structure; the one or more grating structures including doped amorphous silicon; and a light emitting structure disposed over the one or more grating structures, wherein the one or more grating structures are configured to at least one of diffract and refract light being emitted from the light emitting structure.

According to various embodiments, a method for manufacturing an optoelectronic component may include: forming a grating structure on top of a metal electrode, the grating structure including amorphous silicon regions being at least partially embedded into a material having a refractive index different from the refractive index of amorphous silicon.

According to various embodiments, a method for processing a carrier may include: providing a carrier, the carrier including an electrode structure; forming a layer over the electrode structure, the layer including amorphous silicon; patterning the amorphous silicon layer to provide one or more recesses; and filling the one or more recesses of the patterned amorphous silicon layer with a material having a different refractive index than the refractive index of the amorphous silicon According to various embodiments, a method for processing a carrier may further include: performing a chemical mechanical polishing after the one or more recesses of the patterned amorphous silicon layer have been filled.

According to various embodiments, patterning the amorphous silicon layer may include forming a first recess structure in a first region of the amorphous silicon layer and forming a second recess structure in a second region of the amorphous silicon layer, wherein the design of the second recess structure differs from the design of the first recess structure.

According to various embodiments, filling the one or more recesses of the patterned amorphous silicon layer may include applying a conformal deposition process.

According to various embodiments, the one or more recesses of the patterned amorphous silicon layer may be filled with at least one material of the following group of materials, the group consisting of: an oxide, a nitride, an oxynitride.

According to various embodiments, the one or more recesses of the patterned amorphous silicon layer may be filled with at least one material of the following group of materials, the group consisting of: a metal oxide, a metal nitride, a metal oxynitride.

The space between the amorphous silicon regions may not be filled with a metal (e.g. aluminum, titanium, or copper), since this will change the optical characteristic of the grating structure (e.g. of photonic crystals).

According to various embodiments, the one or more recesses of the patterned amorphous silicon layer may be filled with at least one material of the following group of materials, the group consisting of: silicon oxide, silicon nitride, silicon oxynitride.

Illustratively, it may not be possible to deposit poly silicon on top of an aluminum metal stack due to temperature budget reason. The poly silicon deposition usually is done at 550° C. or at a higher temperature, which may be a too high temperature to ensure aluminum stack stability. Amorphous silicon may be deposited at a temperature in the range from about 350° C. to about 400° C. The amorphous silicon may be electrically conductive, e.g. doped. Since doping the amorphous silicon by implant may be excluded because an additional annealing at higher temperature would be necessary to activate the implant, in-situ doped amorphous silicon (a-Si) may be used. After the in-situ doped a-Si deposition has been carried out, the amorphous silicon may be patterned creating on the same substrate line space structures and/or etching holes into the deposited a-Si. After the etch of the a-Si that can be realized with resist mask or with nitride hard mask, a dielectric filling process followed by a CMP process may be carried out, to planarize the surface and end up with a grating on top of the aluminum stack. Thereby, according to various embodiments, a flat surface, done by an underneath metal stack (Al with bottom and top liner) and grating on top, done by alternative a-Si and $SiO_2$ linear structures or by a a-Si plate with holes filled by $SiO_2$, may be provided as an electrode for an OLED, e.g. the OLED may be deposited subsequently.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for manufacturing an optoelectronic component, the method comprising:
   providing an electronic component comprising a metal electrode;
   forming a grating structure on top of the metal electrode, the grating structure comprising amorphous silicon regions at least partially embedded into a material having a refractive index different from the refractive index of amorphous silicon; and
   doping the amorphous silicon regions with a dopant.

2. The method according to claim 1,
   wherein forming the grating structure comprises:

forming a layer over the electrode structure, the layer comprising amorphous silicon;
patterning the amorphous silicon layer to provide one or more recesses;
filling the one or more recesses of the patterned amorphous silicon layer with the material having a different refractive index than the refractive index of the amorphous silicon.

3. The method according to claim 1, further comprising:
forming an optoelectronic structure over the grating structure.

4. The method according to claim 3,
wherein forming the optoelectronic structure comprises forming at least one light emitting diode.

5. The method according to claim 3,
wherein forming the optoelectronic structure comprises forming at least one organic light emitting diode.

6. The method according to claim 1,
wherein forming the grating structure comprises forming a first grating and forming a second grating, wherein the second grating has a different design than the first grating.

7. A method for processing a carrier, the method comprising:
providing a carrier, the carrier comprising an electrode structure;
forming a layer over the electrode structure, the layer comprising amorphous silicon; and, subsequently,
patterning the amorphous silicon layer to provide one or more recesses;
filling the one or more recesses of the patterned amorphous silicon layer with a material having a different refractive index than the refractive index of the amorphous silicon.

8. The method according to claim 7, further comprising:
performing a chemical mechanical polishing after the one or more recesses of the patterned amorphous silicon layer have been filled.

9. The method according to claim 7,
wherein patterning the amorphous silicon layer comprises forming a first recess structure in a first region of the amorphous silicon layer and forming a second recess structure in a second region of the amorphous silicon layer, wherein the design of the second recess structure differs from the design of the first recess structure.

10. The method according to claim 7,
wherein filling the one or more recesses of the patterned amorphous silicon layer comprises applying a conformal deposition process.

11. The method according to claim 7,
wherein the one or more recesses of the patterned amorphous silicon layer are filled with at least one material of the following group of materials, the group consisting of:
silicon oxide,
silicon nitride,
silicon oxynitride.

12. A method for processing a carrier, the method comprising:
providing a carrier, the carrier comprising a dielectric layer having a wiring of electrically conductive material disposed over the carrier;
forming a layer over the dielectric layer, the layer comprising amorphous silicon;
patterning the amorphous silicon layer to provide one or more recesses;
filling the one or more recesses of the patterned amorphous silicon layer with a material having a different refractive index than the refractive index of the amorphous silicon.

13. The method according to claim 12, further comprising:
performing a chemical mechanical polishing after the one or more recesses of the patterned amorphous silicon layer have been filled.

14. The method according to claim 12,
wherein patterning the amorphous silicon layer comprises forming a first recess structure in a first region of the amorphous silicon layer and forming a second recess structure in a second region of the amorphous silicon layer, wherein the design of the second recess structure differs from the design of the first recess structure.

15. The method according to claim 12,
wherein filling the one or more recesses of the patterned amorphous silicon layer comprises applying a conformal deposition process.

16. The method according to claim 12,
wherein the one or more recesses of the patterned amorphous silicon layer are filled with at least one material of the following group of materials, the group consisting of:
silicon oxide,
silicon nitride,
silicon oxynitride.

* * * * *